(12) United States Patent
Kochi et al.

(10) Patent No.: US 6,828,085 B2
(45) Date of Patent: Dec. 7, 2004

(54) EXPOSURE METHOD AND DEVICE MANUFACTURING METHOD USING THE SAME

(75) Inventors: Tetsunobu Kochi, Hiratsuka (JP); Kenji Saitoh, Utsunomiya (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 09/391,633

(22) Filed: Sep. 7, 1999

(65) Prior Publication Data

US 2002/0187440 A1 Dec. 12, 2002

(30) Foreign Application Priority Data

Sep. 10, 1998 (JP) ............................................ 10-272484

(51) Int. Cl.$^7$ .............................. G03F 7/00; G03F 7/20
(52) U.S. Cl. ...................... 430/394; 430/311; 430/312; 430/322; 430/396
(58) Field of Search ................................ 430/311, 312, 430/322, 394, 396

(56) References Cited

U.S. PATENT DOCUMENTS

| 4,456,371 A | 6/1984 | Lin ............................ 355/71 |
| 4,644,170 A | 2/1987 | Komatsu .................. 250/492.2 |
| 4,680,084 A | 7/1987 | Heimann et al. ........... 156/626 |
| 4,869,999 A | 9/1989 | Fukuda et al. .............. 430/311 |

(List continued on next page.)

FOREIGN PATENT DOCUMENTS

| EP | 0 366 367 | 5/1990 |
| EP | 0 534 463 | 3/1993 |
| EP | 0 668 546 | 8/1995 |
| EP | 0 905 577 | 3/1999 |

(List continued on next page.)

OTHER PUBLICATIONS

English translation of JP 07–226362 from JPO, "Method for Forming Photoresist Pattern", Sato, Aug. 1995.*
English translation of JP 7–226362, Yasuhiro, Method for Forming Photoresist Pattern, Aug. 1995.*
Korean Office Action dated Mar. 27, 2003, issued in a corresponding Korean patent application, with English translation.
IBM Technical Disclosure Bulletin, vol. 32, No. 3A, Aug. 1989, p. 431.
European Search Report dated Apr. 18, 2002, issued in corresponding European patent appln. No. 99307119.0–1242, forwarded in a communication dated May 2, 2002.
European Search Report and Communication, dated Aug. 28, 2001, performed by Examiner G. Lipp; search completed as of Aug. 22, 2001, place of search: The Hague.

*Primary Examiner*—Mark F. Huff
*Assistant Examiner*—Nicole Barreca
(74) *Attorney, Agent, or Firm*—Fitzpatrick, Cella, Harper & Scinto

(57) ABSTRACT

A method of producing a semiconductor chip includes (1) a first exposure step for exposing a device range inside a chip on a substrate, to a repetition pattern including a line and a space, wherein an exposure region of the repetition pattern has a size greater than the device range inside the chip, and (2) a second exposure step for exposing the device range inside the chip on the substrate, to a pattern which includes (i) a first line being parallel to the line of the repetition pattern and having substantially the same linewidth as that of the line or a first space being parallel to the space of the repetition pattern and having substantially the same width, and (ii) a second line of a width larger than the line of the repetition pattern or a second space of a width larger than the space of the repetition pattern. The first line overlaps with a portion of lines of the repetition pattern, or the first space overlaps with a portion of spaces of the repetition pattern. Also, the first and second exposure steps are carried out without a developing step interposed therebetween.

8 Claims, 27 Drawing Sheets

U.S. PATENT DOCUMENTS

| | | | |
|---|---|---|---|
| 4,902,899 A | | 2/1990 | Lin et al. .................. 250/492.1 |
| 4,947,413 A | | 8/1990 | Jewell et al. .................. 378/34 |
| 5,087,537 A | * | 2/1992 | Conway et al. ................ 430/15 |
| 5,415,835 A | | 5/1995 | Brueck et al. ............... 430/311 |
| 5,422,205 A | | 6/1995 | Inoue et al. .................... 430/5 |
| 5,532,090 A | | 7/1996 | Borodovsky ................... 430/5 |
| 5,563,012 A | | 10/1996 | Neisser ......................... 430/22 |
| 5,595,843 A | | 1/1997 | Dao ............................... 430/5 |
| 5,702,868 A | | 12/1997 | Kellam et al. ............... 430/312 |
| 5,705,321 A | | 1/1998 | Brueck et al. ............... 430/316 |
| 5,708,925 A | | 1/1998 | Kobayashi et al. ......... 399/120 |
| 5,726,739 A | | 3/1998 | Hayata ......................... 355/67 |
| 5,786,700 A | * | 7/1998 | Jen et al. ..................... 324/713 |
| 5,851,703 A | | 12/1998 | Hasegawa et al. .............. 430/5 |
| 5,851,707 A | | 12/1998 | Shibuya et al. ................. 430/5 |
| 5,998,068 A | * | 12/1999 | Matsuoka ....................... 430/5 |
| 6,011,611 A | * | 1/2000 | Nomura et al. ............... 355/67 |
| 6,087,074 A | | 7/2000 | Hasegawa et al. .......... 430/311 |
| 6,128,068 A | | 10/2000 | Suzuki et al. .................. 355/53 |
| 6,239,861 B1 | | 5/2001 | Nara et al. ..................... 355/53 |
| 6,327,332 B1 | * | 12/2001 | Amemiya et al. ............ 378/34 |
| 6,437,852 B1 | * | 8/2002 | Sugita .......................... 355/53 |

FOREIGN PATENT DOCUMENTS

| | | |
|---|---|---|
| JP | 6-89839 | 3/1994 |
| JP | 6-333795 | 12/1994 |
| JP | 7-226362 | 8/1995 |
| JP | 7-253649 | 10/1995 |
| JP | 2636700 | 4/1997 |
| JP | 2650962 | 5/1997 |
| JP | 9-199390 | 7/1997 |
| JP | 10-207038 | 8/1998 |
| JP | 10-213895 | 8/1998 |
| JP | 11-143085 | 5/1999 |
| WO | WO 94/24610 | 10/1994 |
| WO | WO 96/26468 | 8/1996 |

* cited by examiner

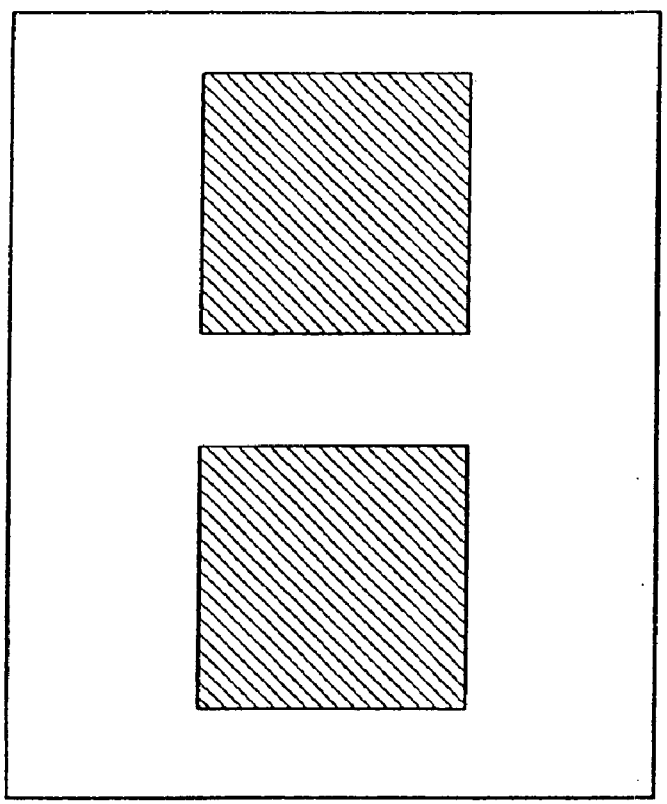
FIG. 17A
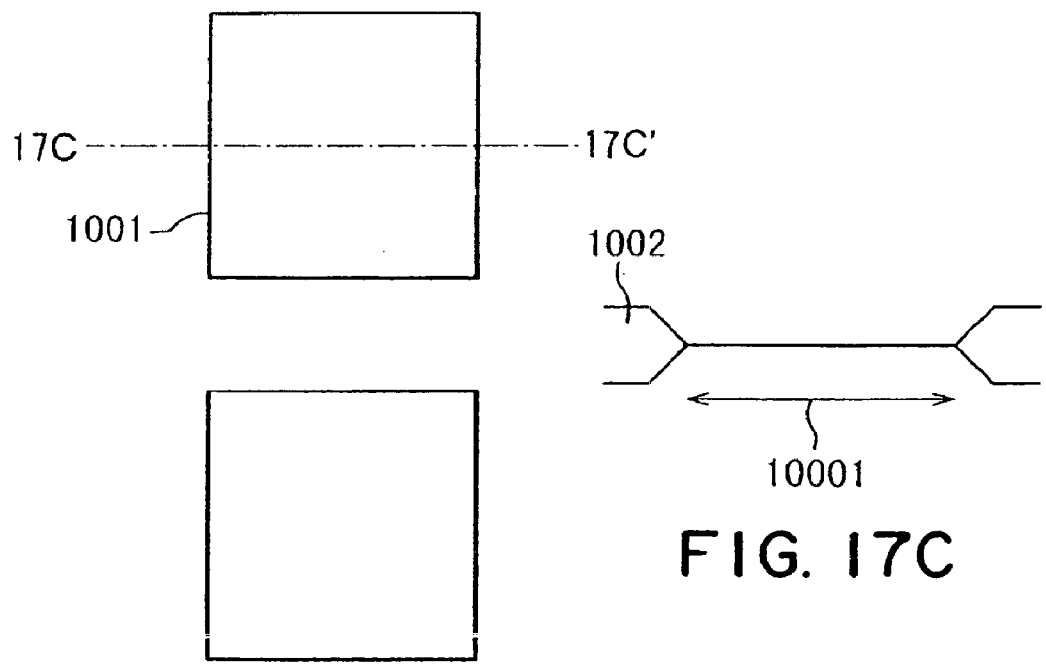
FIG. 17C
FIG. 17B

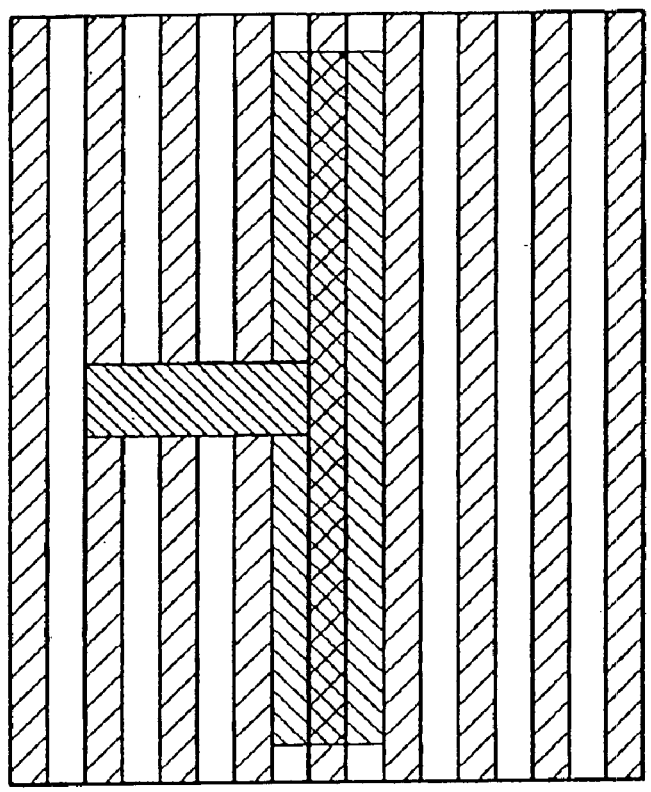
FIG. 19A
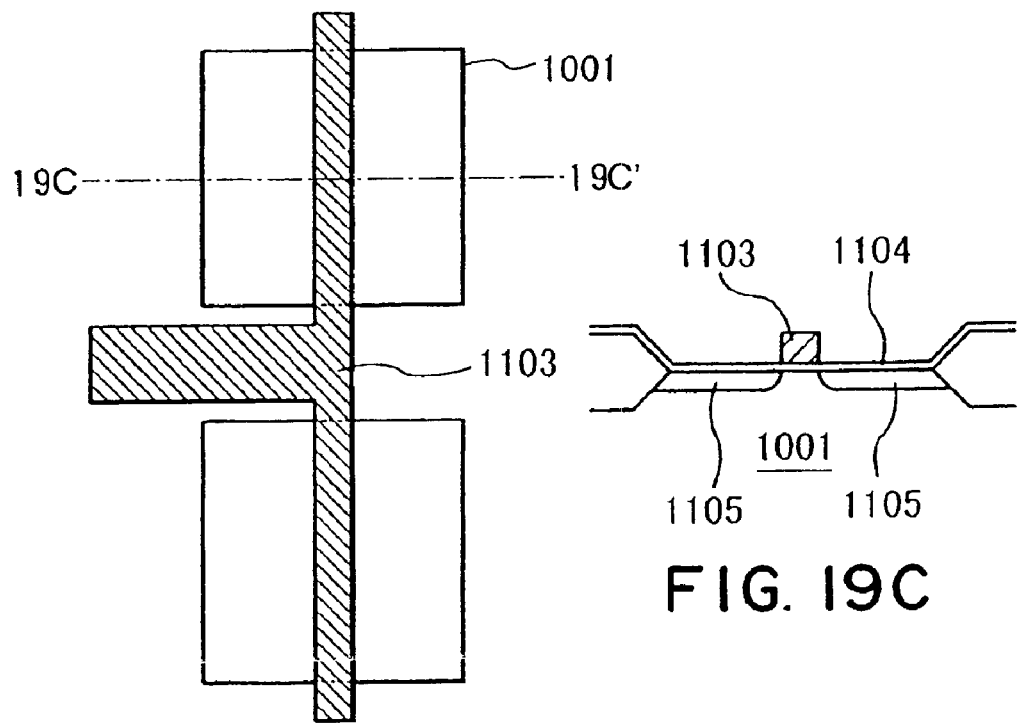
FIG. 19B
FIG. 19C 0 0 0 0 1 0 0 0 0 0

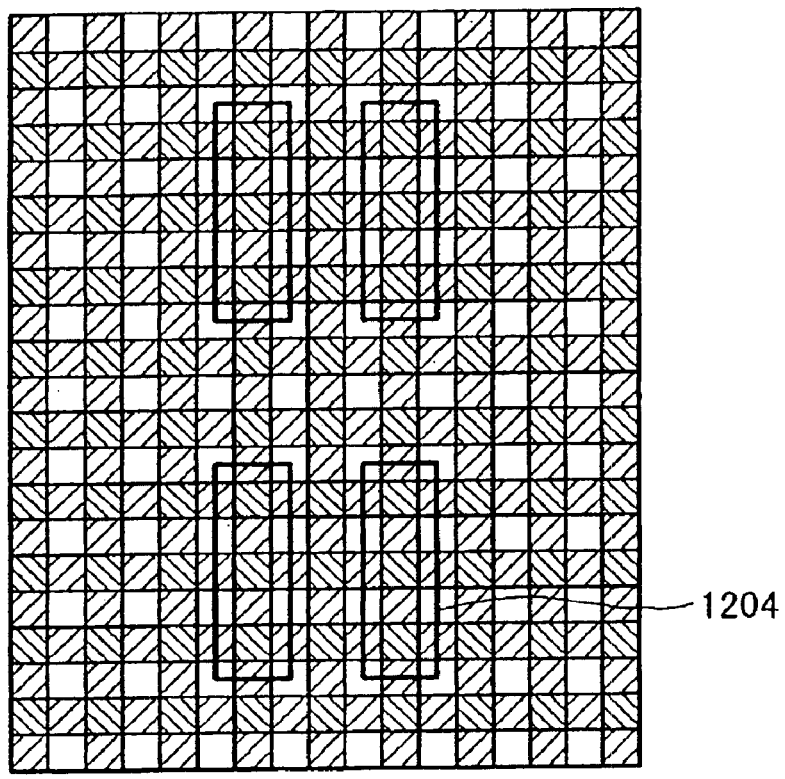
FIG. 26A
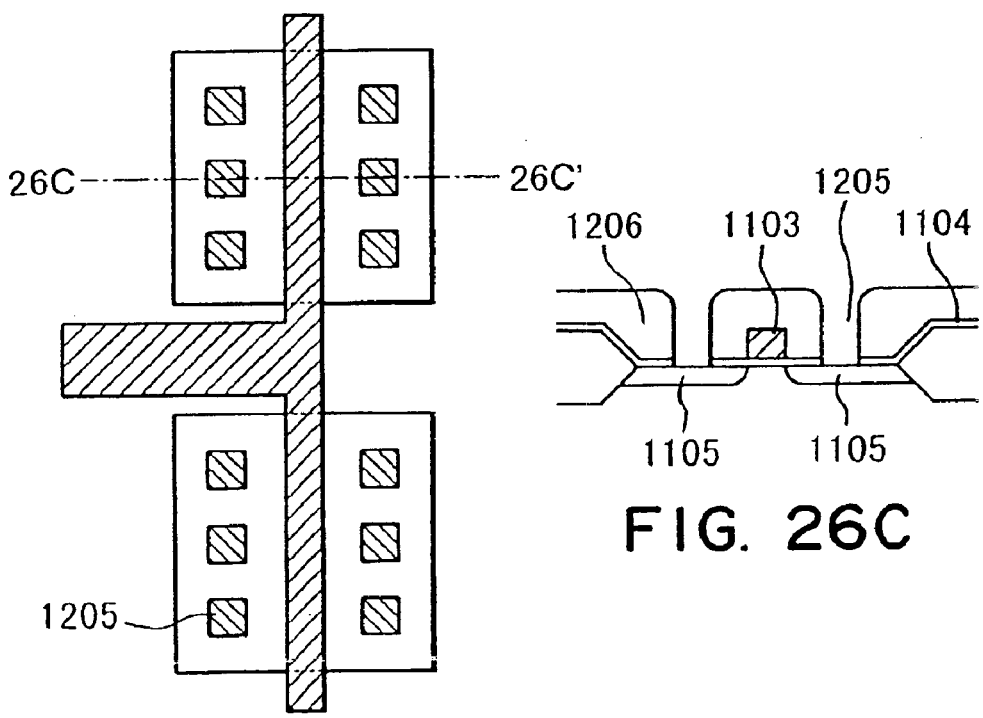
FIG. 26C
FIG. 26B

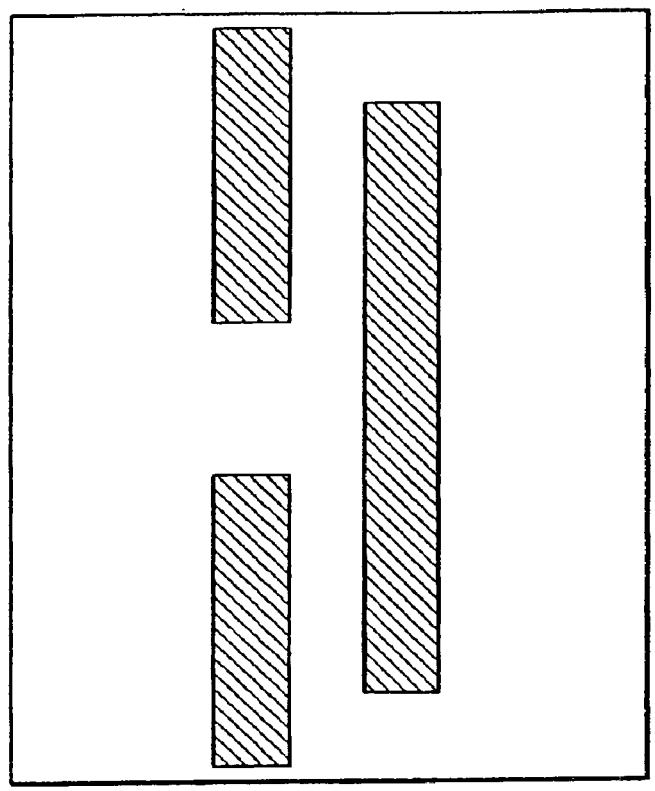
FIG. 27A
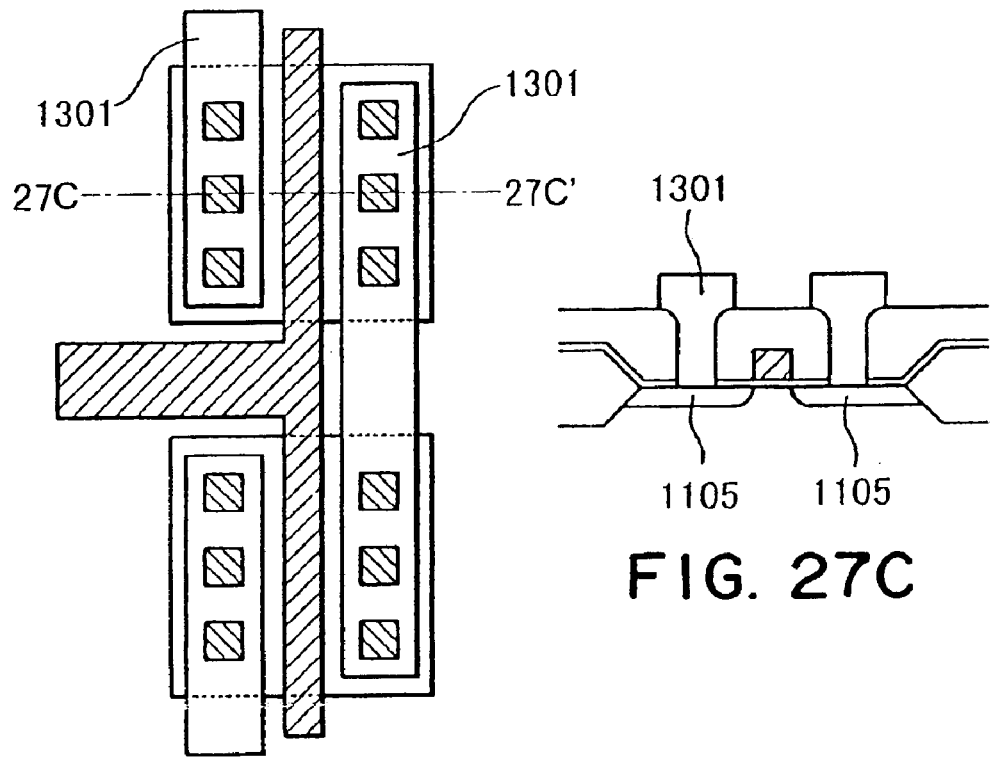
FIG. 27B
FIG. 27C

EXPOSURE METHOD AND DEVICE MANUFACTURING METHOD USING THE SAME

FIELD OF THE INVENTION AND RELATED ART

This invention relates generally to an exposure method. More particularly, the invention is concerned with an exposure method wherein a first exposure process as can be represented by a standard or ordinary exposure process, such as projection exposure, and a second exposure process of a higher resolving power than the first exposure process, are performed so that different types of patterns are printed superposedly to thereby form a desired pattern (hereinafter "goal pattern") of a smallest linewidth corresponding to the second exposure process. The present invention is suitably applicable to the manufacture of chips or devices such as semiconductor chips (e.g., ICs or LSIs), detecting devices (e.g., magnetic heads), micro-machines or image pickup devices (e.g., CCDs), for example.

Currently, many projection exposure apparatuses for the manufacture of devices such as ICs, LSIs or liquid crystal panels, for example, based on photolithography, use a light source of an excimer laser. However, mere use of such an excimer laser as a light source in a projection exposure apparatus does not assure production of a fine pattern of a linewidth of 0.15 micron or narrower.

In order to improve the resolution, theoretically, the numerical aperture (NA) of a projection optical system may be enlarged or the wavelength of exposure light may be shortened. Practically, however, enlargement of the NA or reduction in wavelength of the exposure light is not very easy. For, the depth of focus of a projection optical system is inversely proportional to the square of the NA while it is proportional to the wavelength λ. Because of this, enlarging the NA of a projection optical system results in a decrease of the depth of focus, which causes a difficulty of focusing and a decrease of productivity. Further, most glass materials have an extraordinarily low transmission factor with respect to a deep ultraviolet region. Even for a fused silica (quartz) which is used with a wavelength λ=248 nm (KrF excimer laser), the transmission factor reduces almost to zero when used with a wavelength λ=193 nm or less. Currently, no glass material has been developed that can be practically used in a region of exposure wavelength λ=150 nm or less, corresponding to a fine pattern of 0.15 micron linewidth or less to be produced in accordance with a standard or ordinary exposure process.

Japanese Patent Application, Application No. 304232/1997, now Laid-Open No. 11-143085 (hereinafter, "the earlier Japanese patent application"), filed by the assignee of the subject application, proposes a dual exposure process which is based on a combination of dual-beam interference exposure and standard exposure, wherein a multiple-value exposure amount distribution is applied to a substrate, to be exposed, to assure high resolution exposure. In an embodiment disclosed in the earlier Japanese patent application, the dual-beam interference exposure process is performed by use of a phase shift mask having a line-and-space (L&S) pattern of 0.1 micron linewidth, and a fine linear pattern is printed through coherent illumination. Thereafter, an ordinary exposure process (for example, an exposure process based on partially coherent illumination) is performed while using a mask which is formed with a pattern having portions of different transmission factors and having a shape corresponding to an actual device pattern of a smallest linewidth of 0.1 micron. In accordance with the method disclosed in the earlier Japanese patent application, a pattern of a smallest linewidth of 0.10 micron may be formed through the ordinary exposure process and by using a projection exposure apparatus having a projection optical system which has an image side NA of 0.6.

Another method for the fine pattern printing is a probe exposure method wherein a pattern is drawn and printed on a photosensitive member by using a probe. The probe may be based on AFM using an inter-atomic force, STM using a tunnel current, an electron beam, a laser beam or proximity light, for example. However, performing the probe exposure over the whole exposure area has a disadvantage of low throughput. In consideration of it, those portions of a goal pattern that can be produced through an ordinary exposure process may be photoprinted by using a light quantity larger than an exposure threshold of a photosensitive substrate. On the other hand, those portions of insufficient resolution may be photoprinted by superposed printing which is based on an ordinary exposure and a probe exposure, with the respective light quantities each being lower than the exposure threshold of the photosensitive material but both, when combined, being higher than the exposure threshold. As a result, a multiple-value exposure amount distribution similar to that described above is applied (Japanese Patent Application, Application No. 137476/1998).

SUMMARY OF THE INVENTION

It is an object of the present invention to provide an improved exposure method by which a multiple exposure process such as described above can be applied to assure higher precision production of a device such as a semiconductor chip, for example.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 17A, 17B and 17C are schematic views, respectively, for explaining a process for forming a silicon active region.

FIGS. 19A, 19B and 19C are schematic views, respectively, for explaining the principle of a dual exposure process.

FIGS. 26A, 26B and 26C are schematic views, respectively, for explaining the principle of the triple exposure.

FIGS. 27A, 27B and 27C are schematic views, respectively, for explaining the procedure for forming a wiring region.

DESCRIPTION OF THE PREFERRED EMBODIMENTS

In some preferred embodiments of the present invention to be described below, a fine pattern and a pattern (hereinafter "rough pattern") having a smallest linewidth (upon a substrate) larger than that of the fine pattern, are printed on the substrate superposedly, by which a goal pattern having a smallest linewidth corresponding to that of the fine pattern, is formed on the substrate. This exposure method is called in this specification a "dual exposure" or "multiple exposure". In this exposure method, the region on which the fine pattern is to be printed is exposed with a size that contains the whole chip-inside-device forming region, upon one chip to be produced on a substrate, where a chip-inside-device is to be formed.

Here, the term "chip-inside-device forming region" refers to such a region that includes all of or any one of (i) an active element such as an MOS transistor, a bipolar transistor or a diode, for example, (ii) a passive element such as a resistance element or a capacitance element, for example, and (iii) a connection region for electrical connection of the active element or the passive element.

When the dual exposure is to be performed, a fine pattern should desirably be uniform as much as possible.

In the embodiments of the present invention to be described below, a fine-pattern exposure region is made larger than a chip-inside-device forming region. This enables that a portion not influenced by a micro-loading effect, a proximity effect or an edge effect of the edge of the fine pattern, that is, a portion where the fine pattern is uniform in shape, is used in the chip-inside-device forming region.

Further, if the whole surface of a fine-pattern exposure region is exposed in a single exposure, in connection with the exposure amount, the exposure amount distribution control in a wide range as well as the state after the resist exposure (e.g., oxide diffusion) can be made uniform. Particularly, while in a chemical amplification type resist the time from the exposure to the development has a large influence to the linewidth (CD), this can be made uniform.

The fine pattern in the chip-inside-device forming region can be made uniform through the procedure described above. The reproducibility of a goal can therefore be improved, and thus various devices such as a semiconductor chip, for example, can be manufactured very precisely.

Preferred embodiments of the present invention will now be described with reference to the accompanying drawings.

[Embodiment 1]

Figure 1:
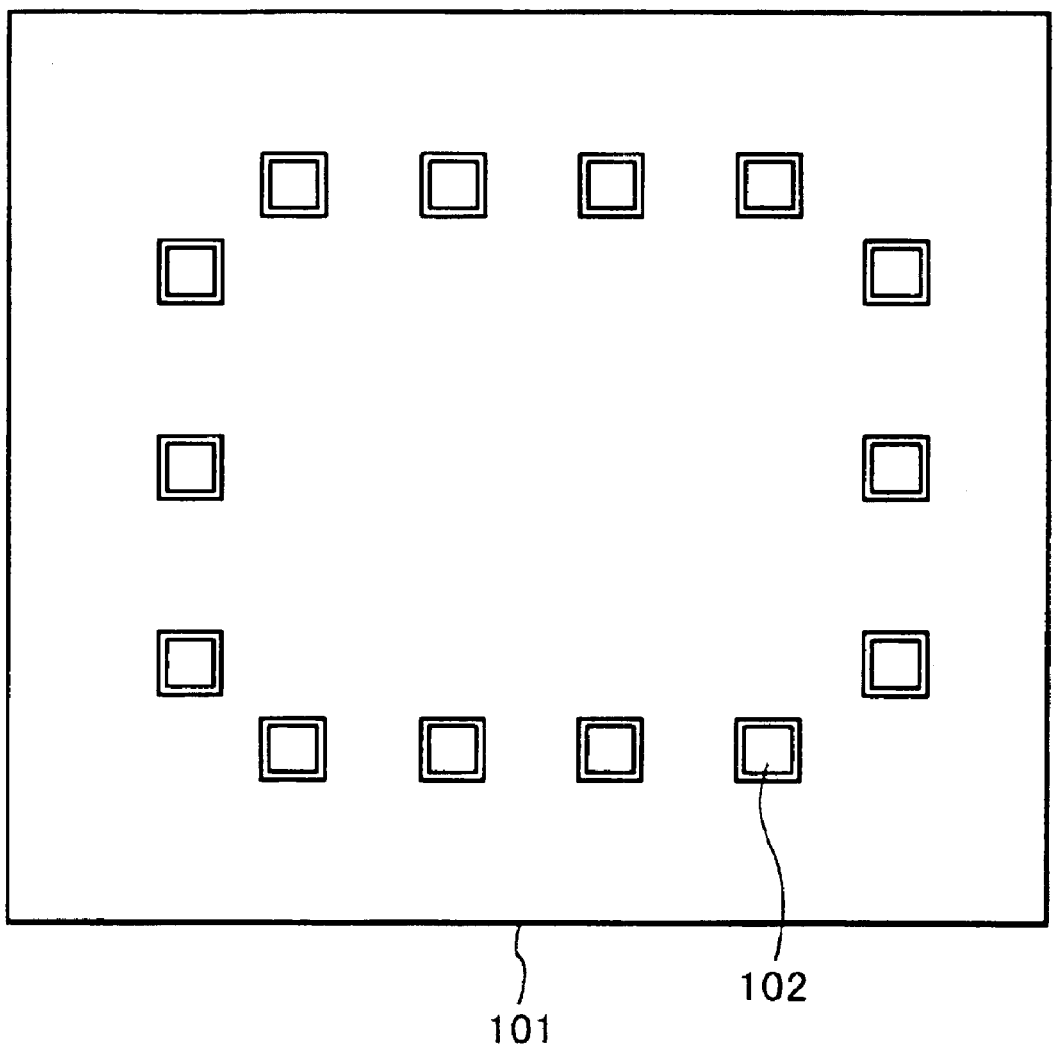
FIG. 1 is a schematic view for explaining an example of the structure of a semiconductor chip, according to an embodiment of the present invention.

A semiconductor chip is provided with pads at its outer peripheral portion, for transmission and reception of signals to and from the outside of the chip. FIG. 1 shows an example, wherein denoted at 101 is a semiconductor chip which is formed on a semiconductor wafer or substrate, and denoted at 102 are pads formed at the outer peripheral portion of the chip. For transmission and reception of a greater amount of information, there are cases where pads are formed along all the four peripheral sides of the chip, such as shown in the drawing.

For example, in a case of a logic integrated circuit, such a semiconductor chip has output pads each having a buffer circuit to which a single-stage or multiple-stage inverter circuit (signal inverting circuit) for driving a large load outside the chip is connected. Also, its input pads have a buffer circuit for driving the inside circuit.

Figure 2:
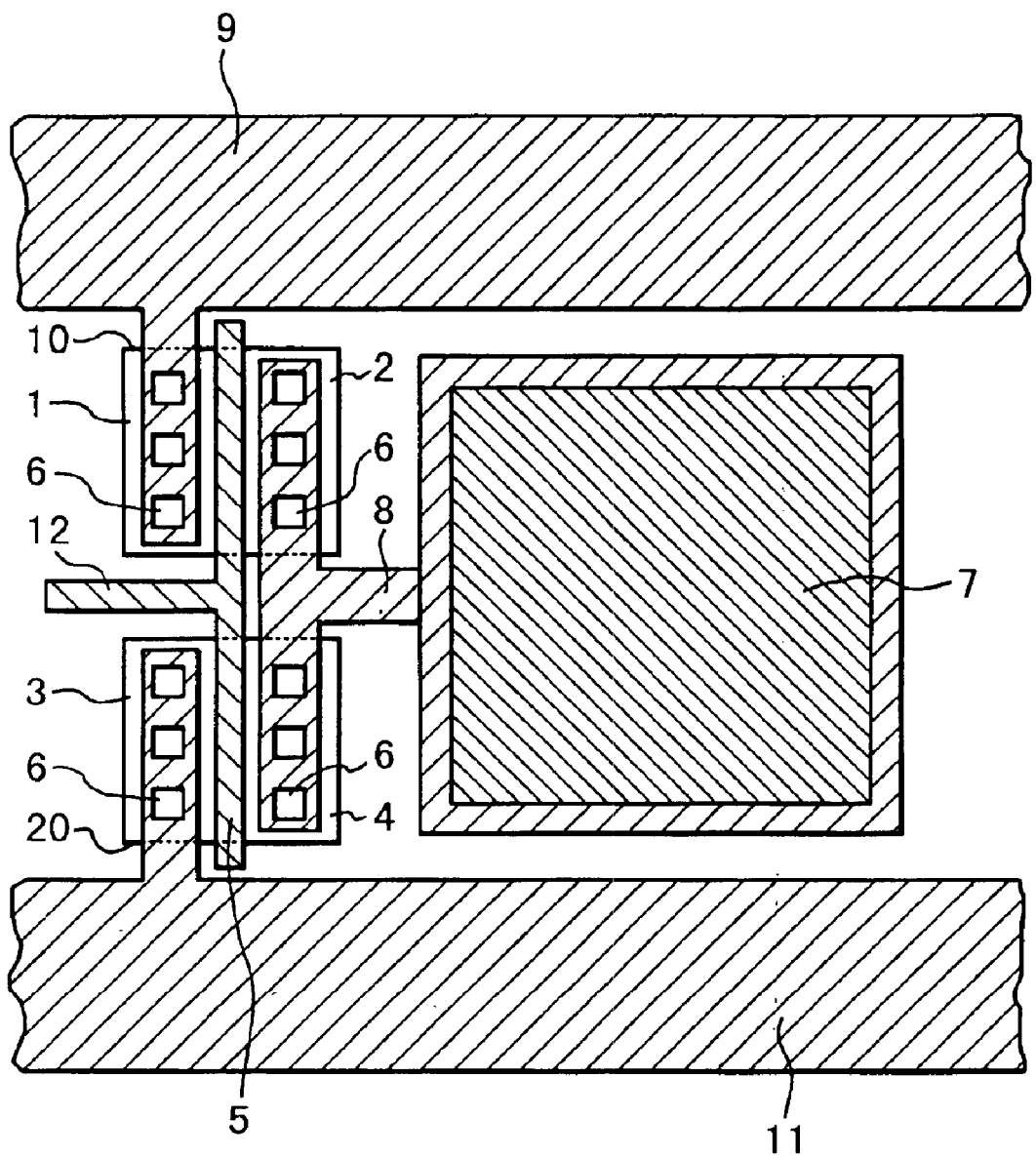
FIG. 2 is a schematic view for explaining an example of the structure of an output buffer circuit in the semiconductor chip of FIG. 1.

FIG. 2 illustrates an example of an output pad having an output buffer circuit. For convenience in explanation, an example of a pad with a single-stage inverter buffer circuit will be described. Denoted in FIG. 2 at 10 is a P type MOS transistor. Denoted at 1 is a source region of the P type MOS transistor, and denoted at 2 is a drain region of the P type MOS transistor. Denoted at 20 is an N type MOS transistor. Denoted at 3 is a source region of the N type MOS transistor, and denoted at 4 is a drain region of the N type MOS transistor. Denoted at 5 is a gate electrode which is used for both of the P type and N type MOS transistors. Denoted at 6 are contacts for connecting the sources and drain regions 1–4 with a wiring layer (wire 8, electric source wire 9 and ground wire 11). Denoted at 7 is a pad for connecting the semiconductor chip with the outside. The drain regions 2 and 4 are connected to the wire 8 through the contacts 6, and the wire 8 is connected to the pad 7. The source region 1 of the P type MOS transistor 10 is connected to the electric source wire 9 through the contact 6. The source region 3 of the N type MOS transistor 20 is connected to the ground wire 11 through the contact 6. The sources and drain regions 1–4 are defined in a silicon active layer at the surface of the silicon substrate, and the wiring layer is formed on an insulating layer (not shown) which is provided on the silicon active layer. The gate electrode 5 is provided by a polysilicone layer, a polycide layer or an accumulation of these layers. With the structure described above, the P type MOS transistor 10 and the N type MOS transistor 20 provide a CMOS inverter. In accordance with a signal transmitted to the gate electrode 5 from an inside circuit (not shown) and through the gate wire 12, an inversion signal thereof is outputted to the pad 7.

Figure 3:
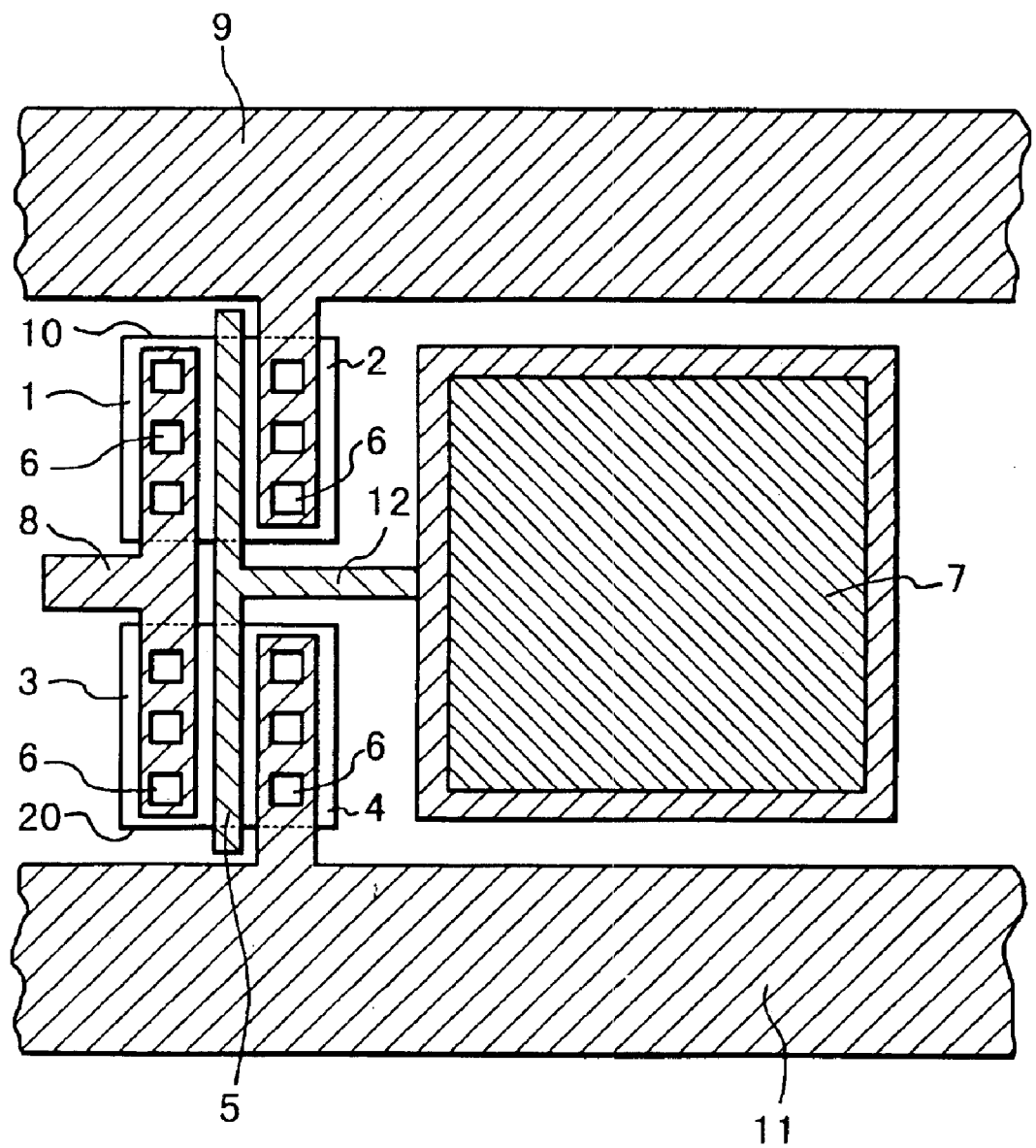
FIG. 3 is a schematic view for explaining an example of the structure of an input buffer circuit of the semiconductor chip of FIG. 1.

FIG. 3 illustrates an example of an input pad having an input buffer circuit. In FIG. 3, like numerals as those of FIG. 2 are assigned to corresponding elements. With the structure as illustrated, in response to application of a signal from the outside to the pad 7, the signal is transmitted to the gate electrode 5 through the gate wire 12, whereby a signal as being inverted by the CMOS inverter is transmitted to the inside circuit (not shown).

Figure 4:
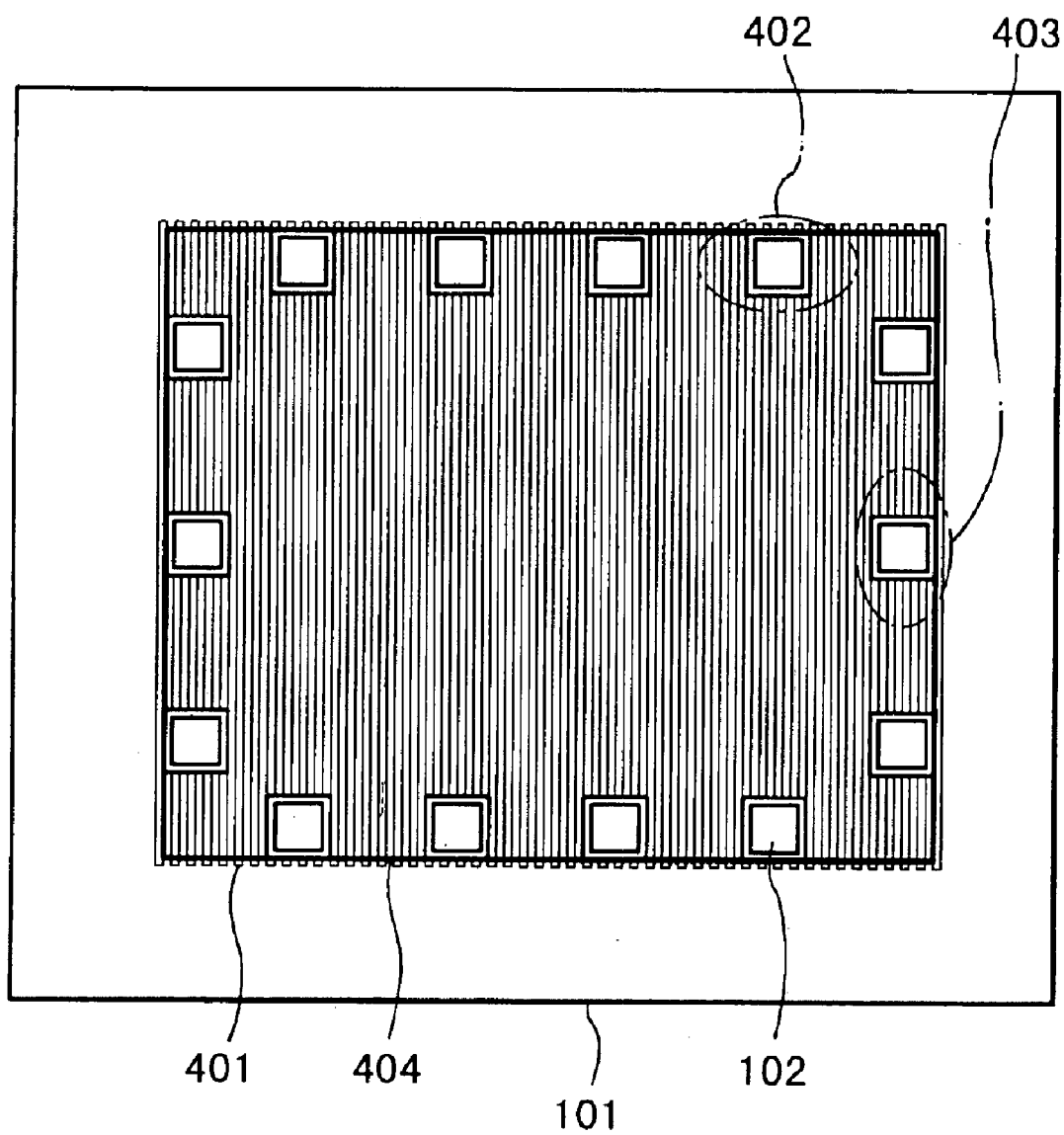
FIG. 4 is a schematic view for explaining an example of the shape and structure of a fine linear pattern which can be used for formation of a fine pattern corresponding to the output and input buffer circuits of the semiconductor chip of FIG. 1.

FIG. 4 illustrates an example of a pattern shape, upon a semiconductor wafer, of a fine linear pattern (a stripe-like fine pattern) in a case where a fine MOS transistor is to be produced in an output buffer circuit and an input buffer circuit of a semiconductor chip on the semiconductor wafer through a convenient process. The production is based on a multiple exposure method wherein a fine linear pattern and a rough pattern having a smallest linewidth, upon a semiconductor wafer or substrate (or as the same is printed on the semiconductor wafer), larger than that of the fine linear pattern are printed on the substrate superposedly, whereby a goal pattern having a smallest linewidth corresponding to that of the fine linear pattern is produced on the wafer.

In FIG. 4, like numerals as those of FIG. 1 are assigned to corresponding elements. Denoted at 401 is a fine linear pattern (periodic pattern). A rough pattern for producing a gage layer, for example, may be formed so that it can be overlapped with the fine linear pattern 401 and, through the dual exposure process, an MOS transistor having a fine gate length can be produced conveniently. In this embodiment, the pattern forming region for forming the fine linear pattern 401 includes input and output buffer circuits, and the whole surface thereof is formed (exposed) into a size slightly larger than a chip-inside-device forming region 404 of the semiconductor chip 101.

Here, the term "chip-inside-device forming region" refers to such a region that includes all of or any one of (i) an active element such as an MOS transistor, a bipolar transistor or a diode, for example, (ii) a passive element such as a resistance element or a capacitance element, for example, and (iii) a connection region for electrical connection of the active element or the passive element. In the example of FIG. 1, it is the region of the semiconductor chip 101 that includes an inside circuit, a peripheral circuit and a connection region for connecting them. In the examples of peripheral circuits shown in FIGS. 2 and 3, it corresponds to a region including P type MOS transistor 10, N type MOS transistor 20, contacts 6 for connecting the transistors 10 and 20 with wires 8, 9 and 11, and a contact (not shown) for connecting the gate 5 (FIG. 3) of the MOS transistors 10 and 20 with the pad 7. The position of the chip-inside-device forming region is not restricted by the placement of the pad 102. A chip-inside-device forming region may be defined in a region between the pad and the outer periphery of the semiconductor chip. Also, the position of the pad is not limited to the proximity to the chip outside periphery. It may be placed closed to the center of the chip.

In a fine linear pattern, due to the influence of the edge effect, the proximity effect or the micro-loading effect, the exposure amount or the resolution decreases at the opposite ends with respect to the direction of its array or its length. In accordance with this embodiment, however, the pattern forming region for forming the fine linear (periodic) pattern 401 is defined by the whole surface exposure to a size notably larger than the chip-inside-device forming region of the semiconductor chip 101, which provides an input/output buffer circuit. As a result of this, the end portion of the fine linear pattern having a lower exposure amount or resolution is positioned outside the chip-inside-device forming region. Therefore, in the chip-inside-device forming region, only a portion of the fine pattern which is uniform with respect to shape can be used. This enables that not only the inside circuit portion of the chip 101 but also the input/output buffer circuit are produced very precisely.

Figure 5:
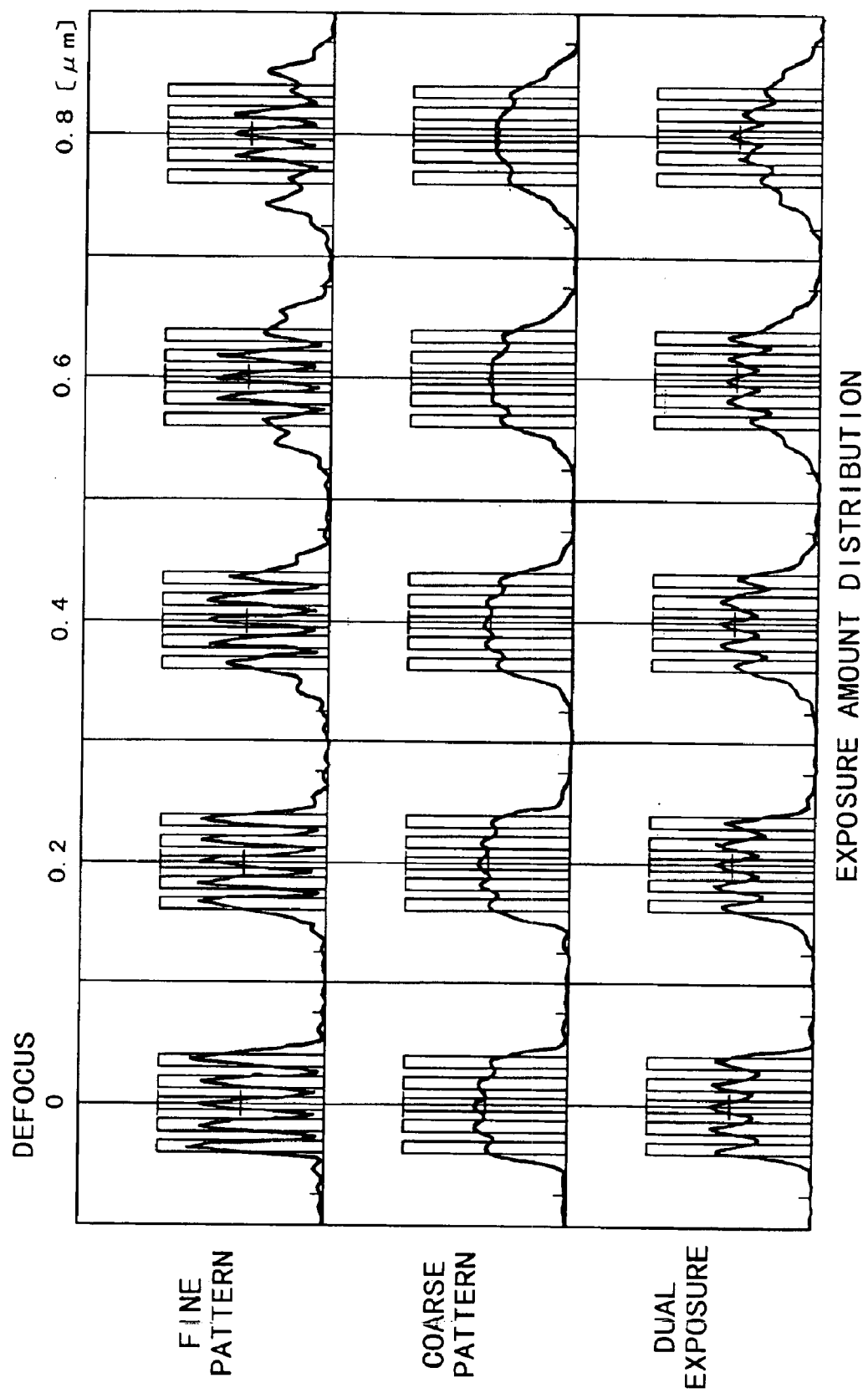
FIG. 5 is a schematic view for explaining the state of exposure, in a case where a fine linear periodic pattern region and a goal pattern region coincide with each other.
Figure 6:
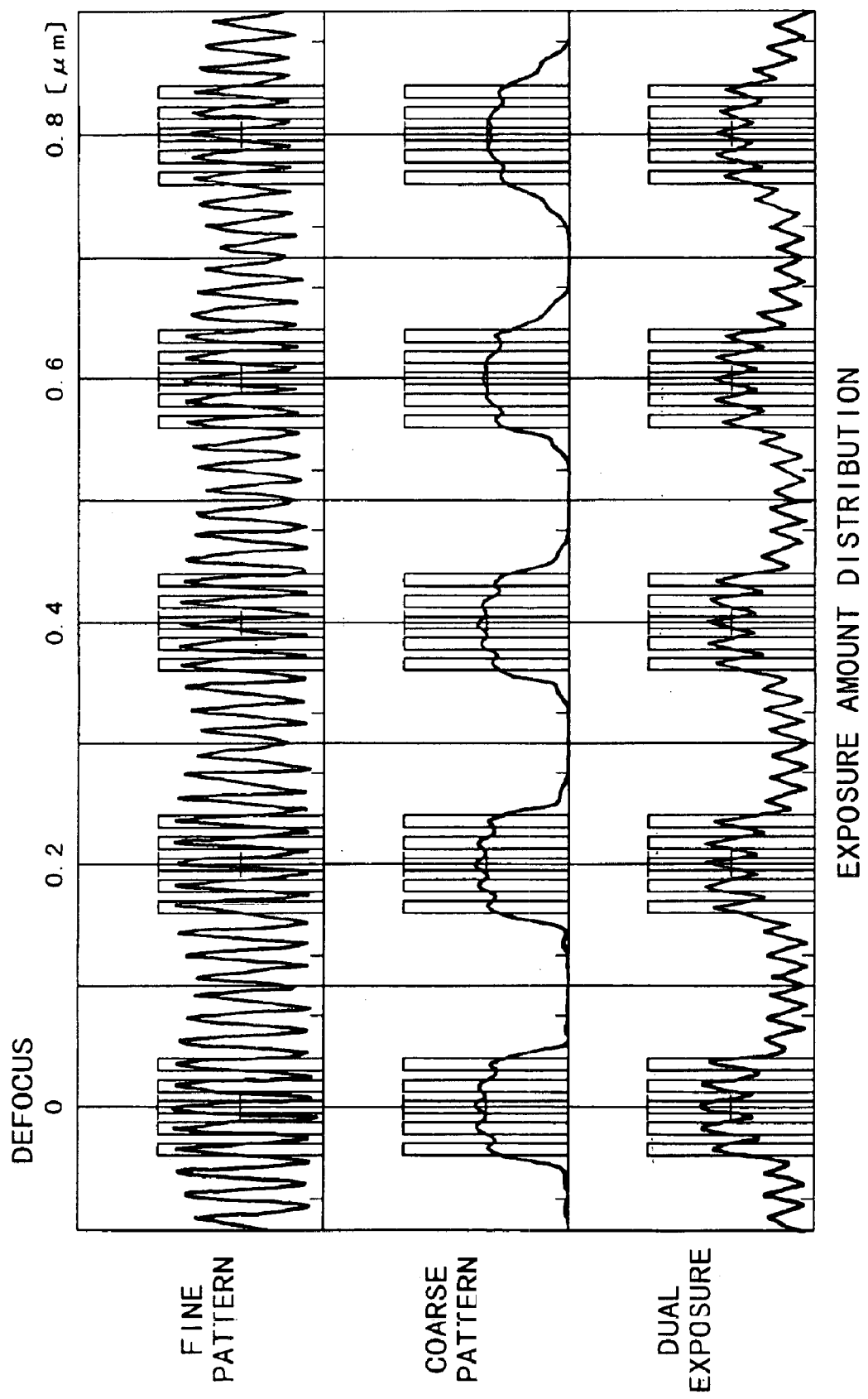
FIG. 6 is a schematic view for explaining the state of exposure, in a case where a fine linear periodic pattern region is magnified, as compared with a goal pattern region, in opposite directions along the direction of array of the fine linear pattern and by an amount corresponding to four lines of the fine linear pattern.

FIGS. 5 and 6 illustrate a difference with respect to the setting of a fine periodic pattern region and a goal pattern (five-bar) region. FIG. 5 shows an intensity distribution in the dual exposure in a case where the fine periodic pattern region is set in the same region as the goal pattern to be produced. FIG. 6 shows an intensity distribution in the dual exposure in a case where the fine periodic pattern region is enlarged so that a goal pattern can be produced satisfactorily. In each of FIGS. 5 and 6, the upper portion shows exposure amount distributions of a fine periodic pattern, using a Levenson type phase shift mask. The middle portion shows exposure amount distributions provided by a rough pattern. The lower portion shows exposure amount distributions provided by the dual exposure. The exposure amount distributions are illustrated with respect to various levels of defocus, varying along the lateral direction in the drawing. In these drawings, exposure amount distributions as well as the positions of the five bars are illustrated.

In the example of FIG. 5, particularly when a defocus occurs, the line shape of the fine periodic pattern at its opposite ends is distorted. Also, as regards the exposure amount distribution provided by the dual exposure, there is a large difference between a central pattern and patterns at the end portions. As compared therewith, in the example of FIG. 6 wherein the fine pattern is set larger than the goal pattern region by four bars at each end, even if a defocus occurs, the difference in exposure amount distribution (after the dual exposure) between the central pattern and patterns at the opposite ends is smaller. Thus, it is seen that the exposure latitude is improved.

Figure 7A:
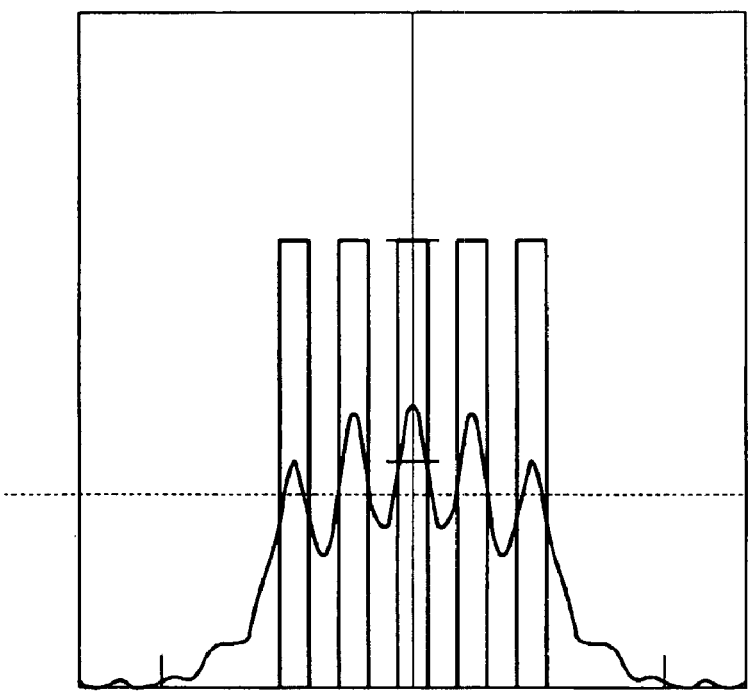
FIGS. 7A and 7B are graphs, respectively, for explaining the width of an exposure amount that can be resolved by the dual exposure method of FIGS. 5 and 6.
Figure 7B:
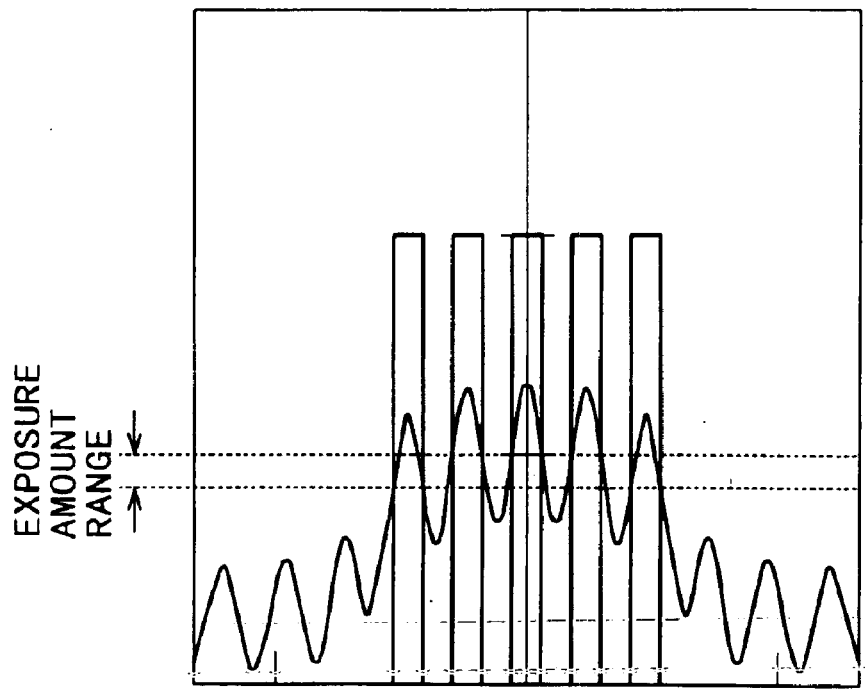

This will be described in more detail, in connection with an example of a defocus of 0.4 micron. FIGS. 7A and 7B show a resolvable exposure amount range. In a case where the region for the goal pattern coincides with the fine periodic pattern region, as shown in FIG. 7A, although the five bars are resolved, the linewidth of each bar varies. As compared therewith, if the fine periodic pattern region is enlarged, as shown in FIG. 7B, all the five bars can be resolved into a desired linewidth. Also, there is a certain range for exposure amount that enables resolution with the desired linewidth.

FIGS. 5, 6, 7A and 7B show results of exposure where the fine periodic pattern and the five bars have a linewidth and a spacing of 0.12 micron, and where an ordinary exposure process is performed by use of a projection exposure apparatus which comprises a light source of a KrF excimer laser ($\lambda$=248 nm) and a projection optical system having an image side NA of 0.6. Table 1 below shows preferable enlargement amounts (pattern bar number) of a fine periodic pattern, in a case where a projection exposure apparatus such as described above is used for the ordinary exposure process and the linewidth and spacing are set at 0.12 micron, 0.13 micron and 0.15 micron, respectively, and in a case where the number of bars of a goal pattern is set, in regard to an isolated pattern, to one, three and five, respectively. In Table 1, the pattern bar number corresponds to the number of glass patterns in a case of a void pattern (the pattern is light transmissive) and to the number of Cr patterns in a case of a residual pattern (the pattern is light blocking).

TABLE 1

| PATTERN BAR NUMBER | PATTERN WIDTH | | |
|---|---|---|---|
| | 0.12 | 0.13 | 0.15 |
| 1 | 3 | 2 | 1 |
| 3 | 4 | 3 | 2 |
| >3 | 4 | 3 | 2 |

As described above, in the case where the linewidth of a fine periodic pattern is 0.12 micron, it is effective in dual exposure to enlarge the fine periodic pattern region by four periodic pattern bars or more as compared with the goal pattern region.

Figure 8:
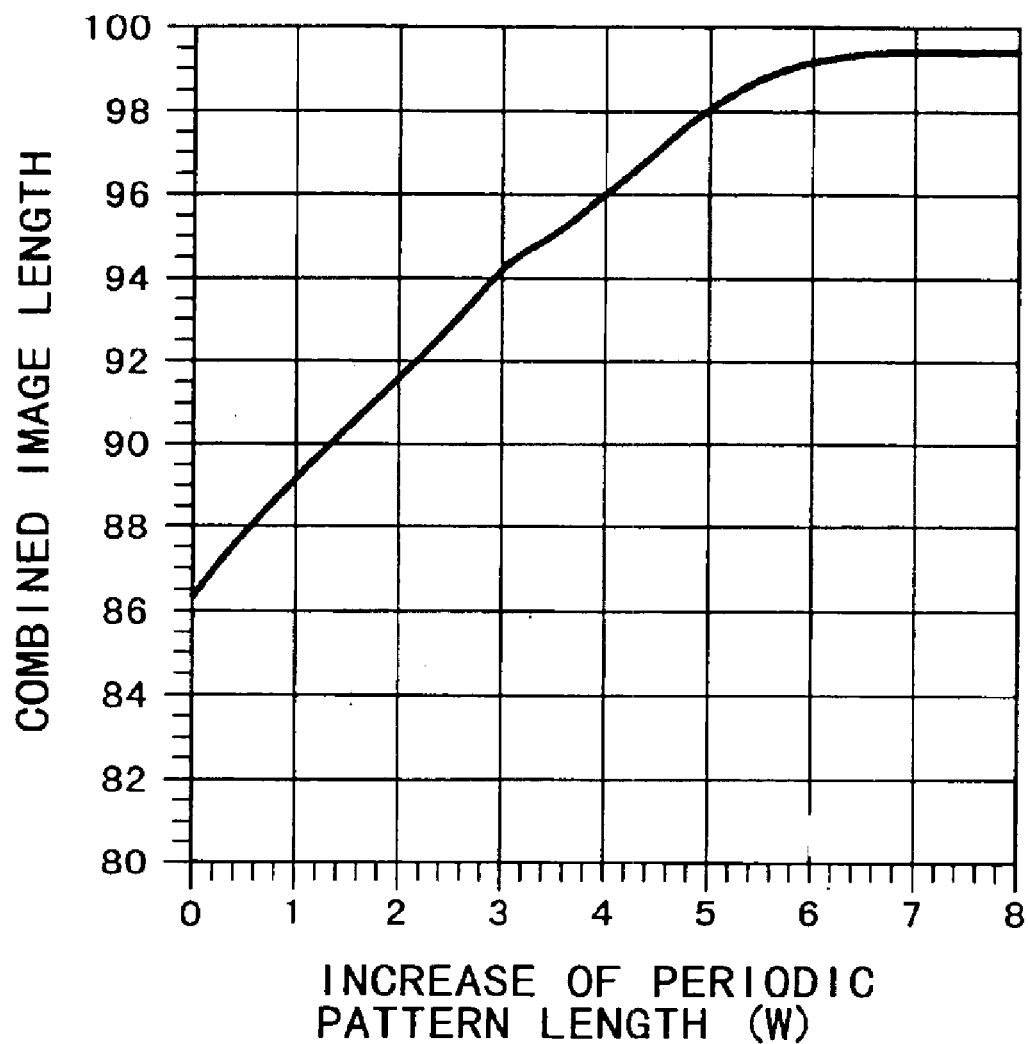
FIG. 8 is a graph for explaining the relation between the length of a pattern to be formed through the dual exposure and an increase in length when a fine linear pattern is enlarged in the lengthwise direction beyond a goal pattern region.

Further, investigations have been made on how much the periodic pattern region should be enlarged in regard to the lengthwise direction of the pattern. FIG. 8 is a graph showing the increase in length of a fine periodic pattern (enlargement in the lengthwise direction) and the length of the pattern to be produced through the dual exposure. Here, the smallest linewidth of the fine periodic pattern is w, and the length of a bar pattern to be formed through the dual exposure of a goal pattern (bar pattern) having a width w and a length 14w is illustrated in terms of percent (%). In a case where the lengthwise direction of the fine periodic pattern is the same as the goal pattern, the length of a pattern produced as a result of dual exposure is shortened by about 14% as compared with the goal pattern. It is seen that, with enlargement of the fine periodic pattern along its lengthwise direction, the amount of shortening is reduced and the shortening is substantially saturated at six times the smallest linewidth. It is therefore preferable that, in regard to the lengthwise direction, the fine periodic pattern is enlarged by six times the smallest linewidth (0.72 micron in the case of a smallest linewidth of 0.12 micron) or more.

In summary, the fine periodic pattern exposure region should desirably be enlarged, at its opposite ends, by four bars or more with respect to the periodic pattern as compared with the goal pattern region (device forming region), and be enlarged by six times or more the smallest linewidth with respect to the lengthwise direction.

[Embodiment 2]

Figure 9:
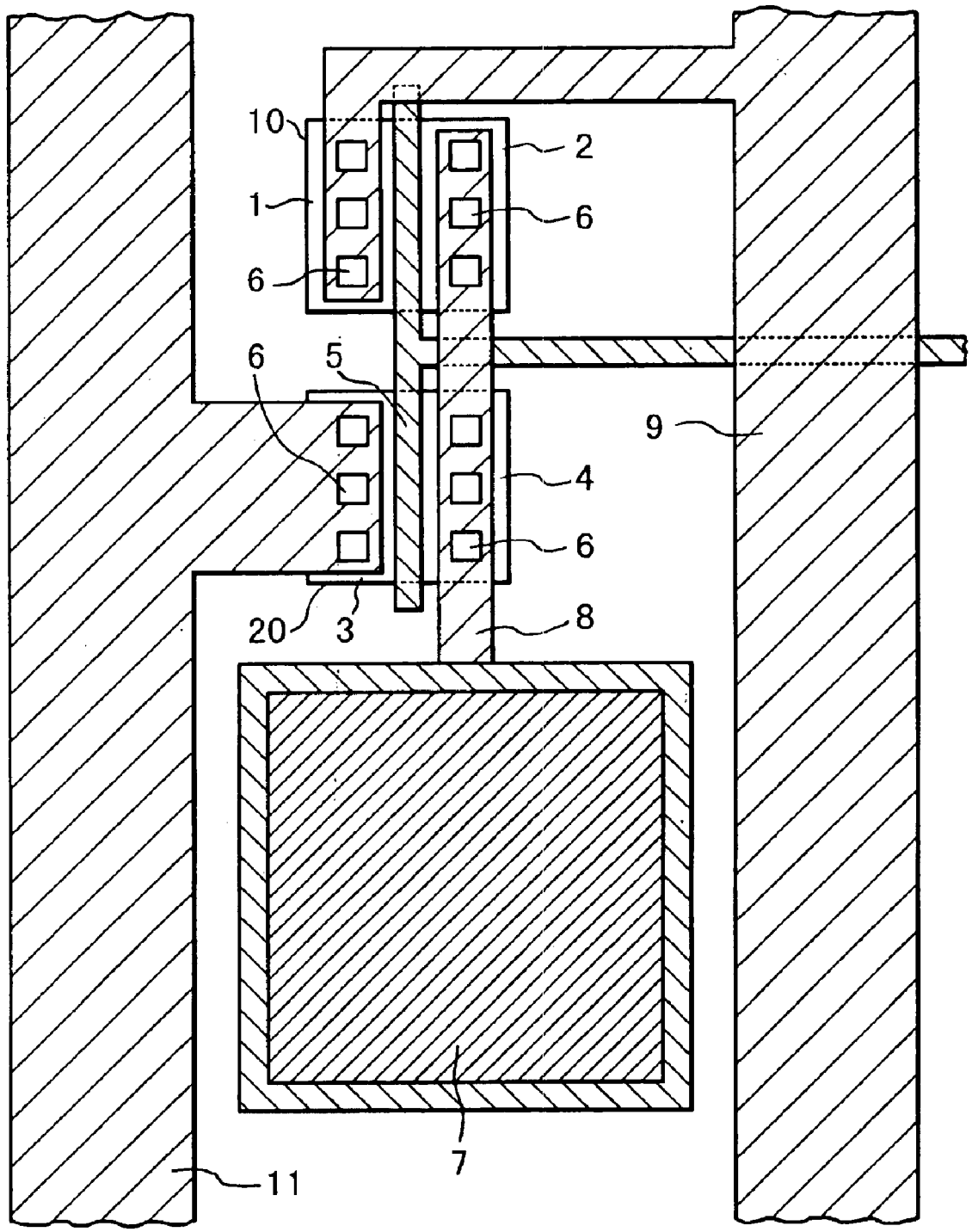
FIG. 9 is a schematic view for explaining an example of the structure where the angle of the output buffer circuit in the semiconductor chip of FIG. 1 differs from that of FIG. 3 by 90 deg.

In a case where, as shown in FIG. 4, all the gate patterns are formed by one and the same type of pattern (fine linear pattern), the pad in the region 402 may be formed in accordance with the layout such as shown in FIG. 2 or 3. However, in regard to the pad of the region 403, the orientation of the buffer circuit will be deviated from the pad by 90 deg. as shown in FIG. 9. As a result, depending on the pad array, the length of the electric source wire 9 connecting the buffer circuit varies. This causes a difference in series resistance and, thus, a difference in operation speed of the buffer circuit.

Further, while there are a voltage source wire and a ground wire 11 around the pad such as shown in FIG. 2, 3 or 9, if the size of the inverter is large or plural inverters are connected in multiple stages, the size of one side of the buffer circuit may become larger than the size of the pad. On that occasion, depending on the orientation of the buffer circuit, the element may not be placed efficiently between these wire regions, which may cause an increase in chip size.

Figure 10:
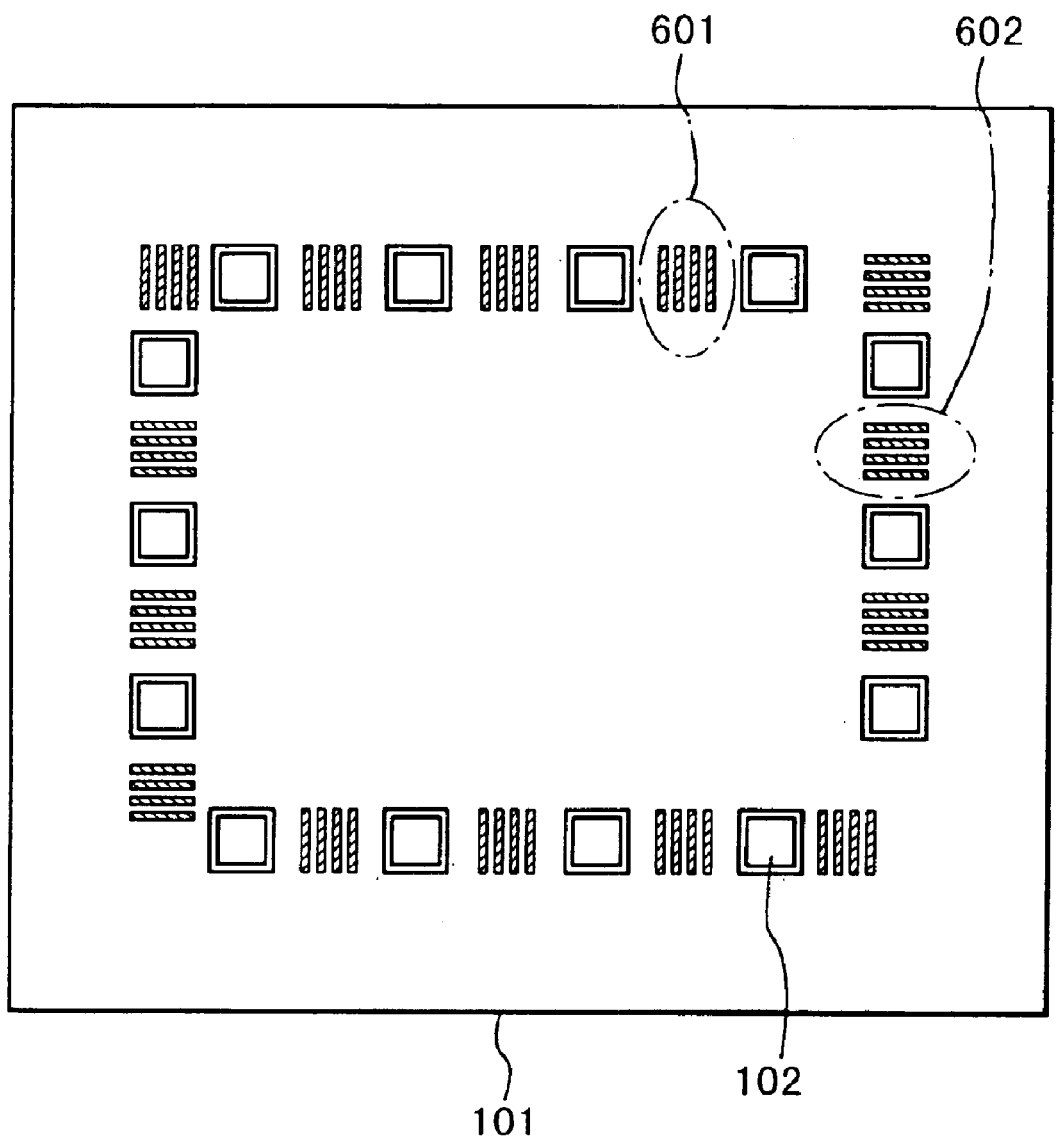
FIG. 10 is a schematic view for explaining an example of the structure of a pad portion in a semiconductor chip according to a second embodiment of the present invention.

FIG. 10 illustrates an example of the structure of a pad in a semiconductor chip according to a second embodiment of the present invention. This embodiment is based on a multiple exposure method in which a fine linear pattern and a rough pattern having a smallest linewidth larger than the linewidth of the fine linear pattern are printed superposedly, such that a goal pattern having a smallest linewidth corresponding to the linewidth of the fine linear pattern is produced. Specifically, in this embodiment, there are plural fine linear patterns having at least two different angles. Thus, this embodiment provides a further improvement to the first embodiment described hereinbefore.

Figure 11:
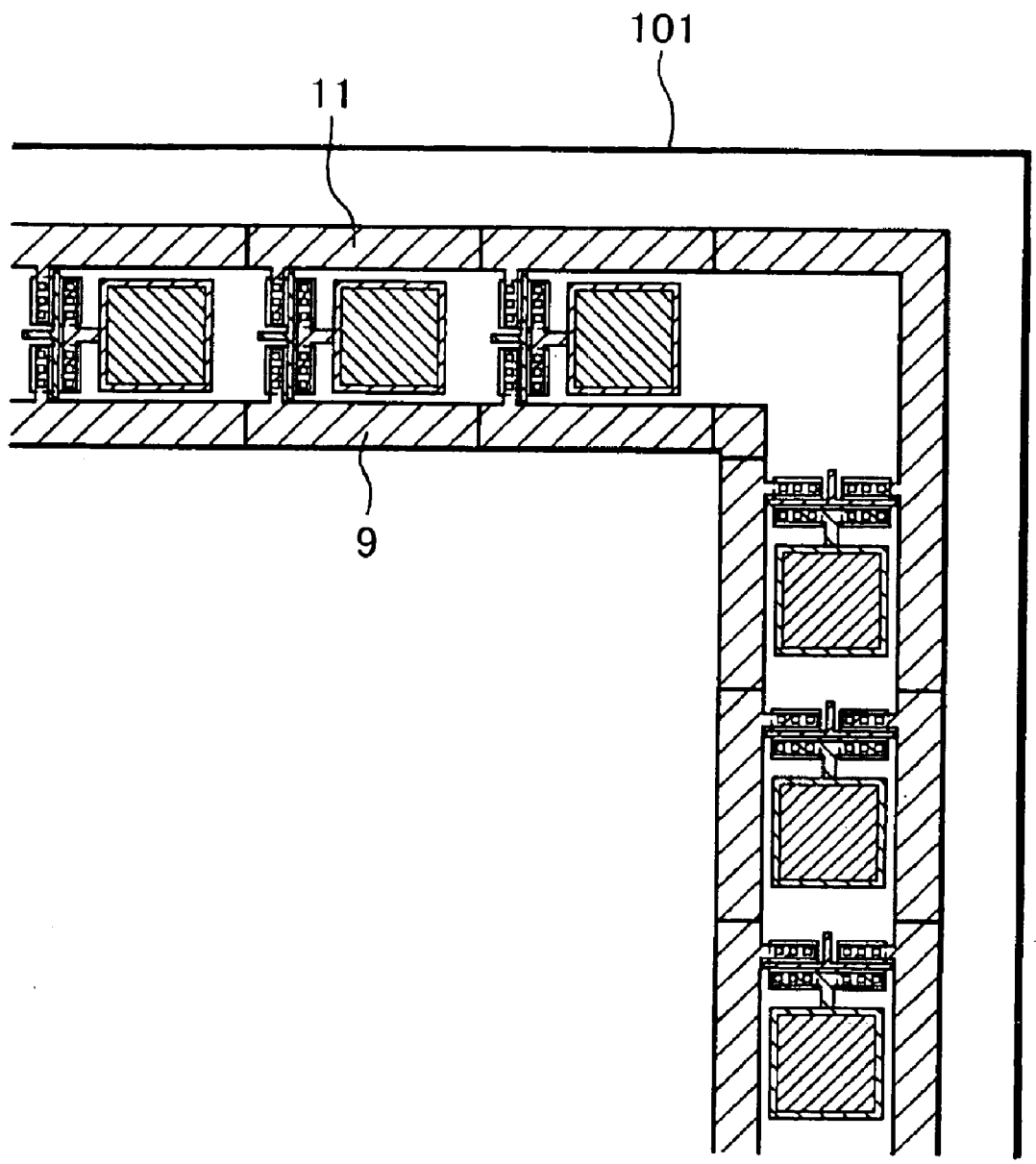
FIG. 11 is an enlarged view of an upper right portion of the semiconductor chip of FIG. 10.

In FIG. 10, like numerals as those of FIG. 1 are assigned to corresponding elements. Denoted in FIG. 10 at 601 is a first fine linear pattern group, and denoted at 602 is a second fine linear pattern group which defines a right angle to the first fine linear pattern group 601. When a gate for a buffer circuit is formed by use of the fine linear pattern shown in FIG. 10, the relative positional relation between a pad and a corresponding buffer circuit can be held constant, at all the peripheral sides of the semiconductor chip. FIG. 11 is an enlarged view of the right upper portion of the chip of FIG. 10. As shown in the drawing, the orientation of the fine linear pattern may be changed in accordance with the placement of the pad, to thereby change the orientation of the MOS transistor. In this manner, a number of buffer circuits of uniform operation characteristic can be disposed in large integration.

[Embodiment 3]

The present invention is not limited to pads, but it is applicable also to placement of transistors inside a semiconductor chip.

Figure 12:
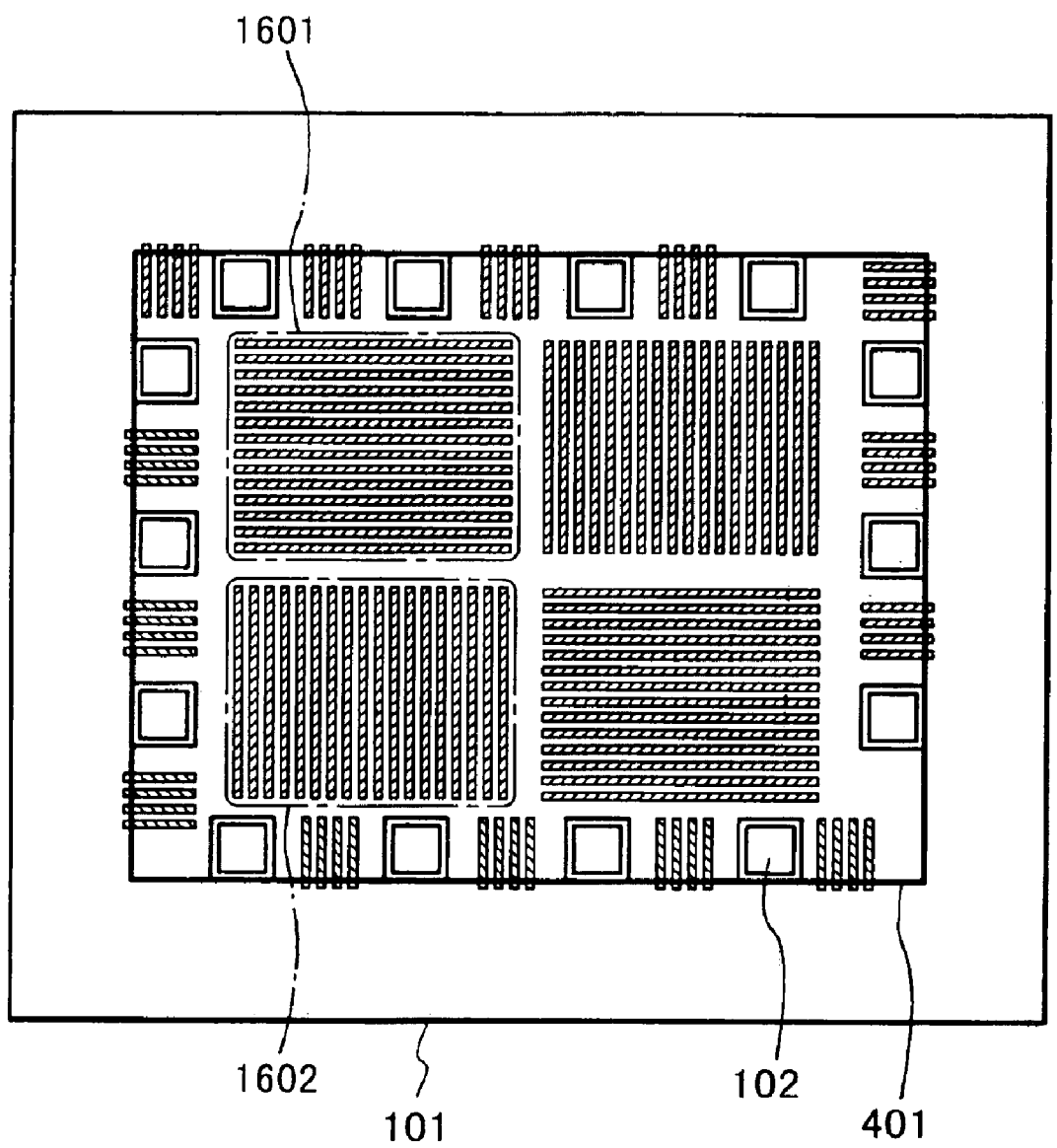
FIG. 12 is a schematic view for explaining an example where a fine pattern is placed inside a semiconductor chip.
Figure 13:
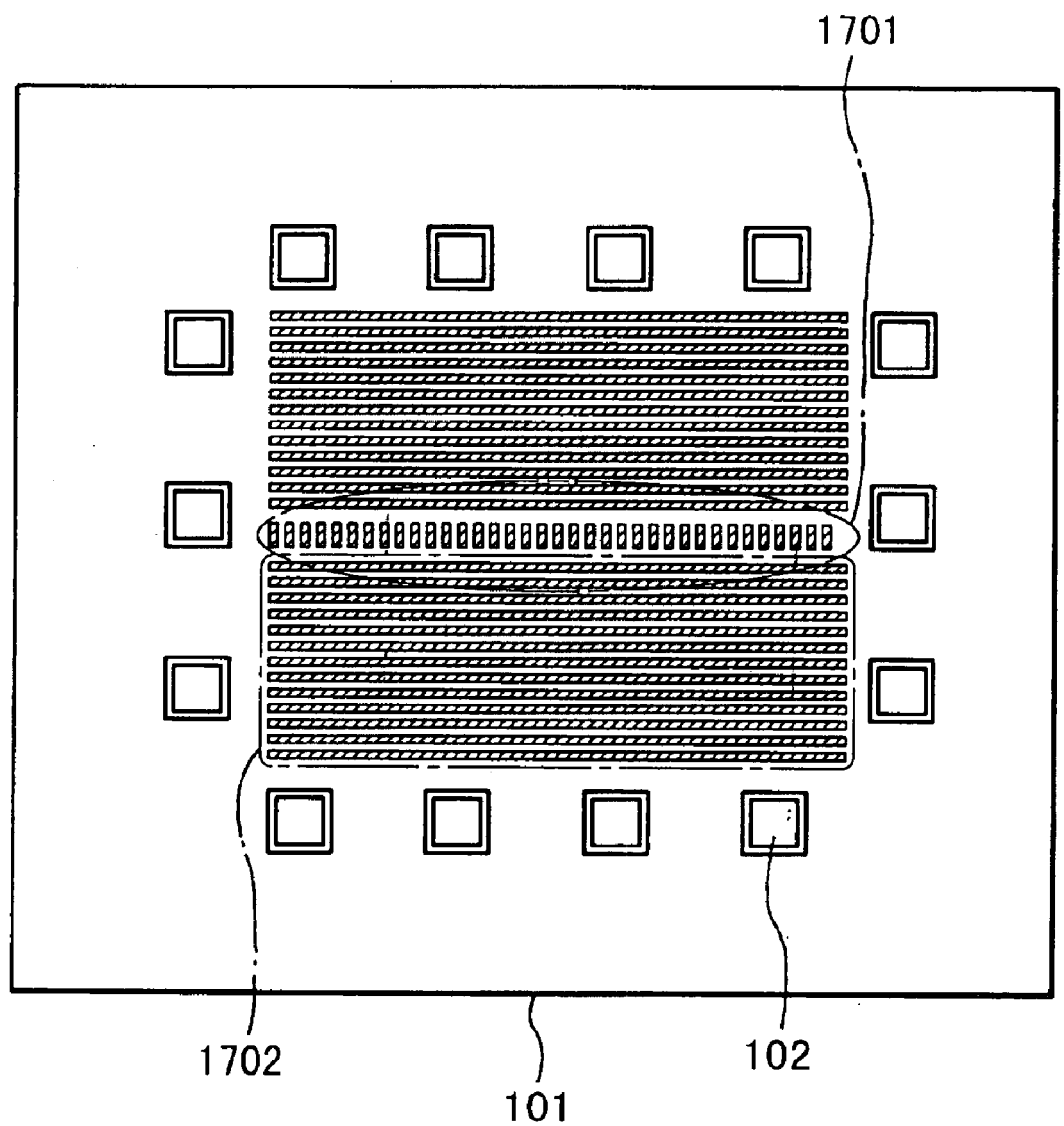
FIG. 13 is a schematic view for explaining another example where a fine pattern is placed inside a semiconductor chip.
Figure 14:
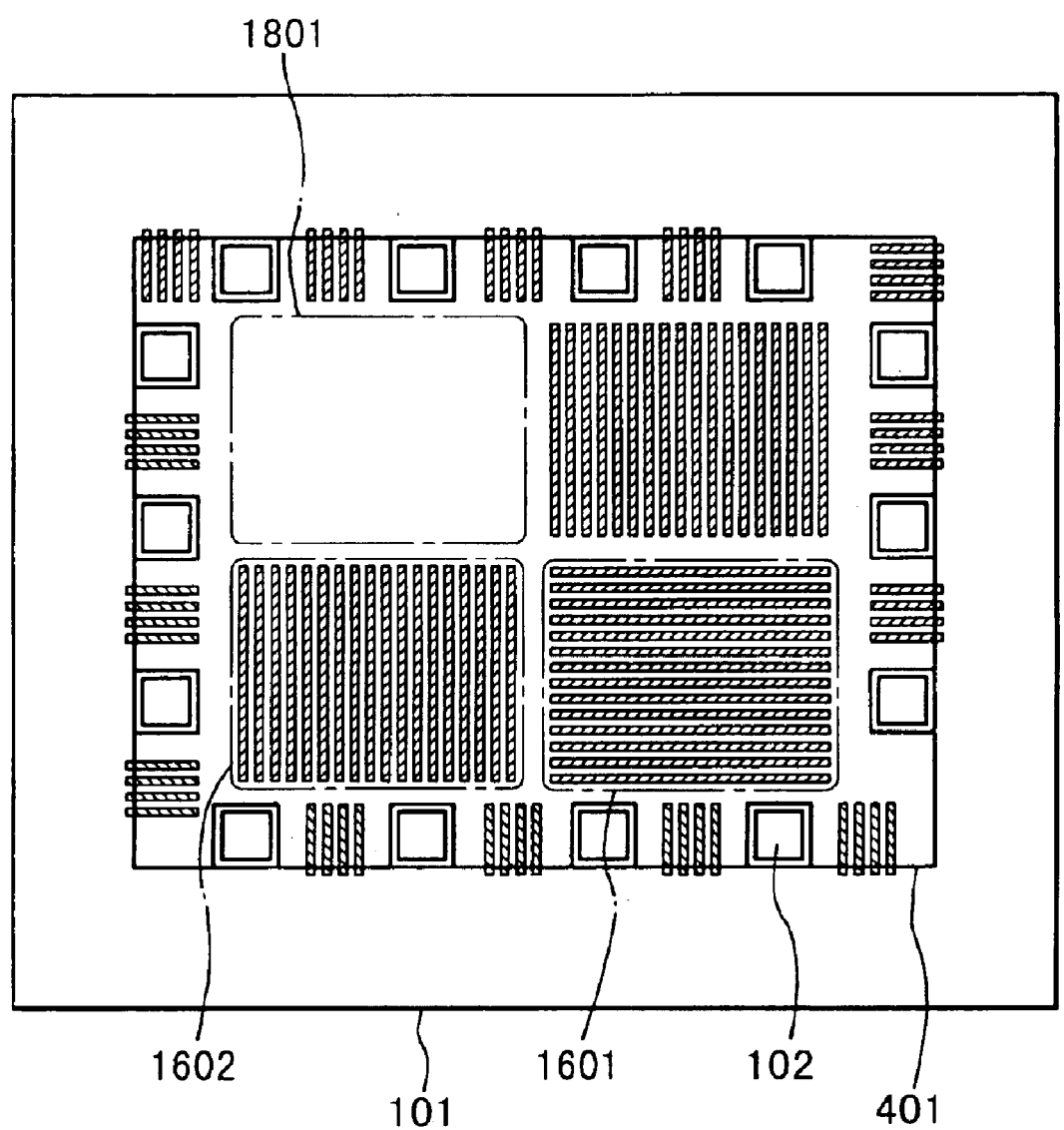
FIG. 14 is a schematic view for explaining a further example where a fine pattern is placed inside a semiconductor chip, together with a void portion.

FIGS. 12, 13 and 14 show examples wherein fine patterns are formed also inside a semiconductor chip. As shown in FIG. 12, fine patterns may be formed throughout the whole surface of a fine-pattern exposure region. Also, as shown in FIG. 14, the patterns may be formed in the fine-pattern exposure region, except an inside portion thereof. In FIG. 14, denoted at 1801 is a void region without a fine linear pattern. As shown in FIGS. 12–14, plural fine linear pattern groups having different array directions may be formed. In FIGS. 12–14, the first fine linear pattern 1601 or 1701 and the second fine linear pattern 1602 or 1702 are arrayed in orthogonal directions.

[Embodiment 4]

Figure 15:
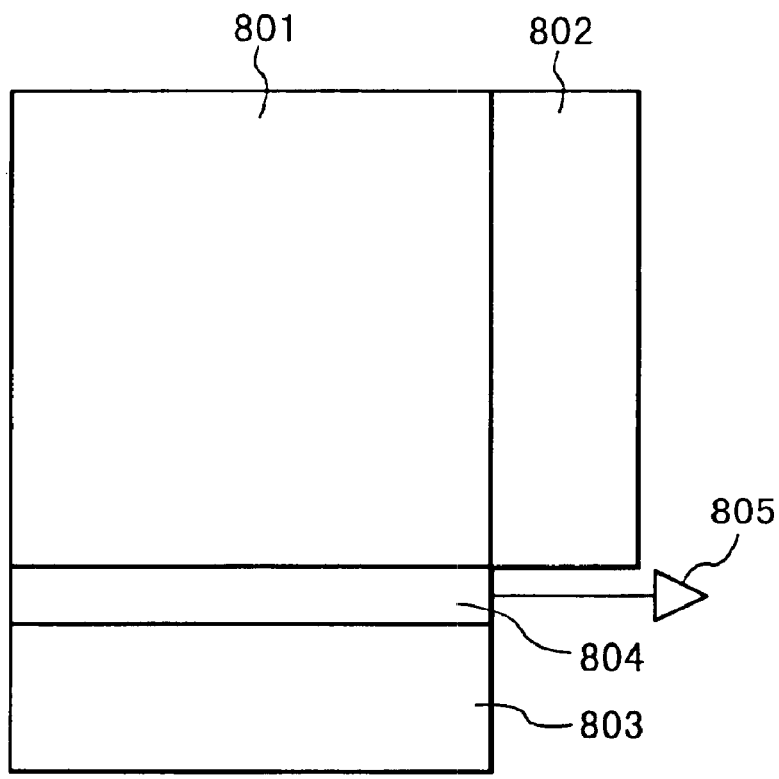
FIG. 15 is a schematic view for explaining an example of the structure of a matrix type photoelectric converting device, which can be produced in accordance with a multiple exposure process of the present invention.

FIG. 15 shows an example wherein the concept of the second embodiment is applied to a matrix type photoelectric converting device which can be formed on a semiconductor wafer (substrate) as a single device. Denoted in FIG. 15 at 801 is a photoelectric converting element region in which photoelectric converting elements are arrayed in a matrix. Denoted at 802 is a vertical scan circuit, and denoted at 803 is a horizontal scan circuit. Denoted at 804 is a horizontal reading circuit, and denoted at 805 is an output amplifier.

Electric charges as produced by photoelectric converting elements are directly read out by the horizontal reading circuit 804, or they are read out after being amplified by amplifying elements which are provided in association with the photoelectric converting elements, respectively, in an order as determined by the selection through the vertical scan circuit 802. After this, in the order as selected by the horizontal scan circuit 803, they are read out sequentially through the output amplifier 805.

Here, the vertical scan circuit 802 functions to perform sequential selection in the vertical direction, and, for it, generally a combination of a CMOS inverter and a transfer switch or a combination of an N or P type MOS transistor and a capacitance element is known. On the other hand, the horizontal scan circuit 803 has a circuitry similar to that of the vertical scan circuit 802, but the scan direction thereof differs from that of the vertical scan circuit 802 by 90 deg. For this reason, with respect to large integration and efficient placement, it is necessary that the MOS transistors constituting the circuits 802 and 803 have orientations being different by 90 deg. from each other.

Figure 16:
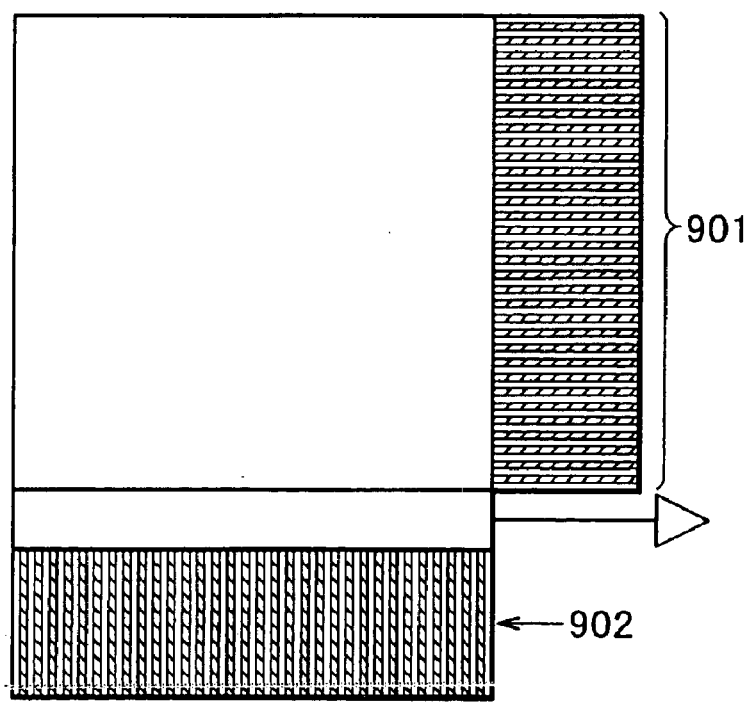
FIG. 16 is a schematic view for explaining an example of the layout of a fine linear pattern, for forming a fine pattern of a chip-inside-device, in the device of FIG. 15.

FIG. 16 shows the shape of a fine linear pattern for accomplishing the circuit of this embodiment. Denoted in the drawing at 901 is a first fine linear pattern group, and denoted at 902 is a second fine linear pattern group having its orientation different from the first fine linear pattern group by 90 deg. The first fine linear pattern group 901 is used to form a gate portion of an MOS transistor which constitutes the vertical scan circuit 802, while the second fine linear pattern group 902 is used to form a gate portion of an MOS transistor which constitutes the horizontal scan circuit 803. This enables efficient placement of circuits.

Another example of a circuit which performs similar matrix driving is a liquid crystal display device, and, as a matter of course, similar advantageous results are attainable in that case. In place of a sequential scan circuit, a decoder circuit may be used. Also, in such a case, similar advantageous results are obtainable. Further, similar advantageous results can be attained in cases of memories such as DRAM, SCRAM, or flash memory, for example.

Further, this embodiment is applicable also to the manufacture of mechanical devices such as a micro-machine, for example, not only to a semiconductor device.

While the example described above concerns a case where fine linear patterns are arrayed horizontally (0 deg.) and vertically (90 deg.) as viewed in the drawing, the present invention is not limited to this arrangement. Any other angles may be used. Further, different fine linear patterns having three or more different orientations may be used in accordance with a circuitry to be produced.

[Embodiment 5]
(Manufacture of Device Structure)

FIGS. 17A through 25B are schematic views for explaining the procedure for manufacturing a chip-inside-device structure according to the present invention, on the basis of the multiple exposure method.

FIGS. 17A–17C show a process for forming a silicon active region. A mask pattern such as shown in FIG. 17A may be exposed by using an ordinary projection exposure apparatus having an exposure wavelength λ=248 nm (KrF excimer laser) and a projection optical system with an image side NA of 0.6, whereby a photoresist pattern with a portion corresponding to the silicon active region being remained may be formed on a semiconductor wafer. Then, a silicon oxide film region may be formed outside that pattern by using a selection oxidation method (LOCOS), for example. This region may function as a device separation region, such that a silicon active region can be produced. FIG. 17B is a plan view thereof, a FIG. 17C is a sectional view taken along a line 17C–17C' in FIG. 17B. In FIGS. 17A–17C, denoted at 1001 is a silicon active region which can thus be formed, and denoted at 1002 is a device separation region which comprises an electrically insulating layer.

Figure 18A:
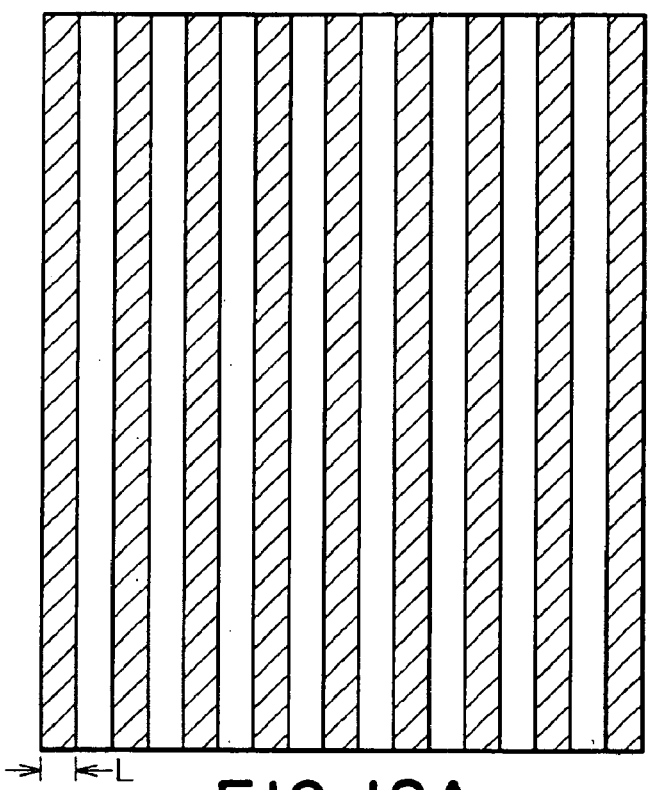
FIGS. 18A and 18B are schematic views, respectively, for explaining the principle of a dual exposure process.
Figure 18B:
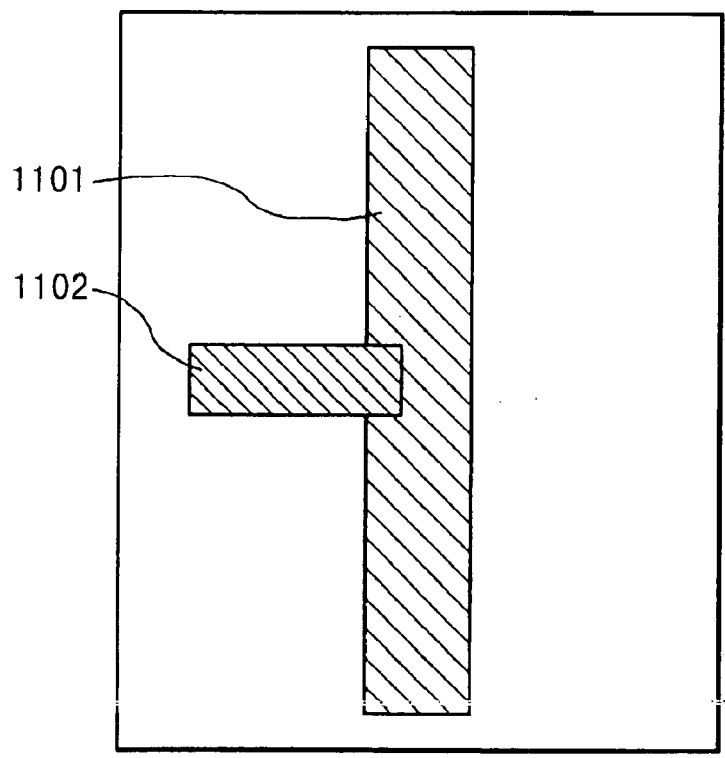

FIGS. 18A and 18B as well as FIGS. 19A–19C illustrate the principle of a dual exposure method for forming a gate region. FIG. 18A shows a Levenson pattern having a linewidth and a spacing of L, as being printed on a semiconductor wafer. FIG. 18B shows a rough pattern. The rough pattern comprises a pattern region 1101 having a transmission factor 1, and a pattern region 1102 having a transmission factor 2. The smallest linewidth and spacing of these pattern regions, as being printed on the semiconductor wafer, are set to 2L or more. The Levenson pattern and the rough pattern are photoprinted superposedly on a substrate shown in FIG. 19A, in accordance with the dual-beam interference exposure method as described hereinbefore. Here, the exposure threshold $E_{th}$ of the photoresist on which these patterns and the exposure amounts in the pattern regions are set in an appropriate relation with each other. As a result, a photoresist pattern (goal pattern) such as a pattern 1103 shown in FIG. 19B which corresponds to a gate having a smallest linewidth L, in the state being printed on the semiconductor wafer, can be produced. Here, the transmission factors 1 and 2 are referred to only for convenience in explanation, and they have no specific physical significance.

A gate insulation film may then be formed on the silicon active region 1001 (FIGS. 17B and 17C) by thermal oxidation of the silicon. Thereafter, a polysilicon layer may be formed through a CVD (chemical vapor deposition) method, for example. The polysilicon layer may then be etched and patterned in accordance with the photoresist pattern having been formed through the dual exposure method described above, whereby a gate pattern of a smallest linewidth L can be formed. FIG. 19B is a plan view of it, and FIG. 19C is a sectional view taken along a line 19C–19C' in FIG. 19B. In FIGS. 19B and 19C, denoted at 1103 is a gate region of polysilicon, for example, and denoted at 1104 is a gate insulation film. Denoted at 1105 are a source and a drain region of an MOS transistor, which are formed by impurity injection based on the ion injection method performed after the formation of the gate region 1103.

Figure 20A:
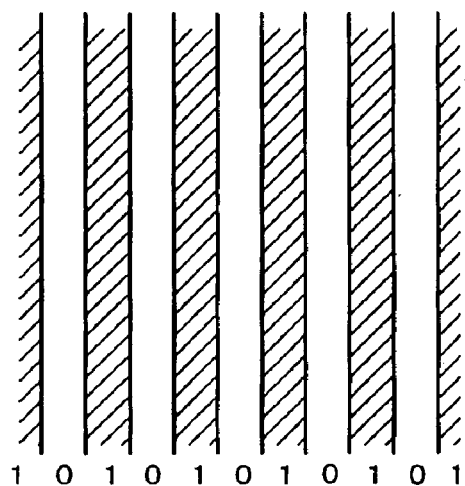
FIGS. 20A and 20B are schematic views, respectively, for explaining an exposure pattern in fine linear exposure.
Figure 20B:
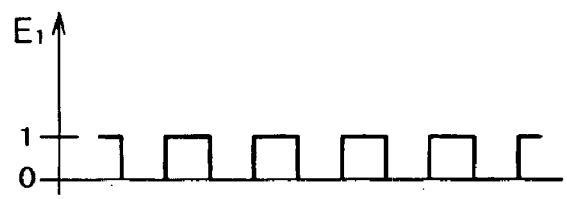
Figure 21A:
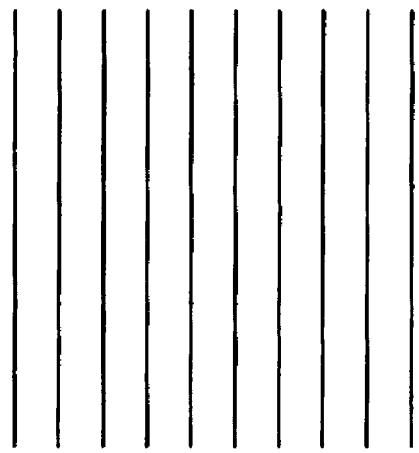
FIGS. 21A and 21B are schematic views, respectively, for explaining an exposure pattern in dual exposure, corresponding to a portion without a rough pattern.
Figure 21B:
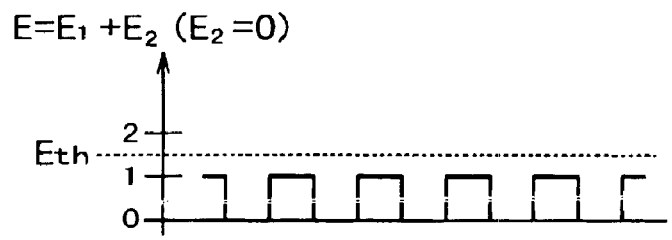

The principle of dual exposure in the embodiment described above will be explained in greater detail, with reference to FIGS. 20A through 22B. In the dual exposure process, as compared with the ordinary exposure sensitivity setting, as shown in FIGS. 20A–21B, where the maximum exposure amount in the periodic pattern exposure (Levenson pattern exposure or dual-beam interference exposure, for example) is taken as 1, the exposure threshold value $E_{th}$ of a resist of a photosensitive substrate is set to be larger than 1. In this photosensitive substrate, when an exposure pattern (exposure amount distribution) as defined by the periodic pattern exposure only is developed, the exposure amount is insufficient. Therefore, while there may be a small variation in film thickness, a portion having a zero film-thickness is not produced as a result of the development, and no lithographic pattern is produced by the etching. Thus, this can be regarded as disappearance of a periodic pattern. Here, although the dual exposure will be explained below with reference to an example where a negative type photoresist is used, the dual exposure process can be used with a positive type photoresist. FIGS. 20A and 21A show a lithography pattern (nothing is produced), and FIGS. 20B and 21B show the relation between the exposure amount distribution and the exposure threshold. The reference character $E_1$ in FIGS. 20B and 21B denotes the exposure amount in the periodic pattern exposure, and the reference character $E_2$ denotes the exposure amount in the ordinary projection exposure.

The dual exposure process has a feature that an exposure pattern of high resolution which may apparently disappear only through the periodic pattern exposure is mixed with an exposure pattern of a desired shape, including a pattern of a size not larger than the resolving power of the ordinary projection exposure, such that only a desired portion of a resist is selectively exposed by an amount not lower than the exposure threshold of the resist, whereby a desired lithographic pattern can be finally produced.

Figure 22A:
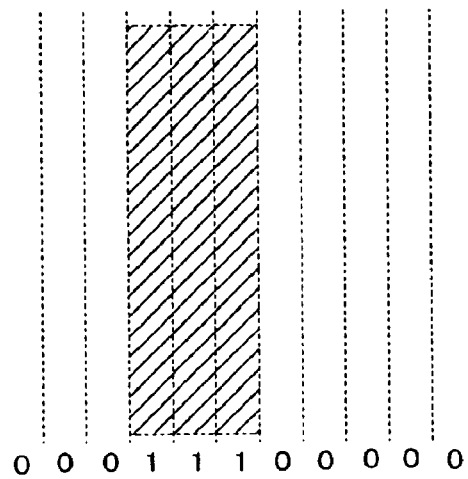
FIGS. 22A and 22B are schematic views, respectively, for explaining an exposure pattern in an ordinary projection exposure.
Figure 22A:
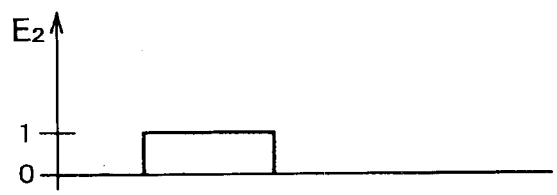

FIG. 22A shows an exposure pattern provided by ordinary projection exposure. In this embodiment, the resolution of ordinary projection exposure is set to be about a half of that of the dual-beam interference exposure for the periodic pattern exposure. Thus, the linewidth of the exposure pattern by the projection exposure as illustrated is about twice the linewidth of an exposure pattern by the dual-beam interference exposure.

Figure 22B:
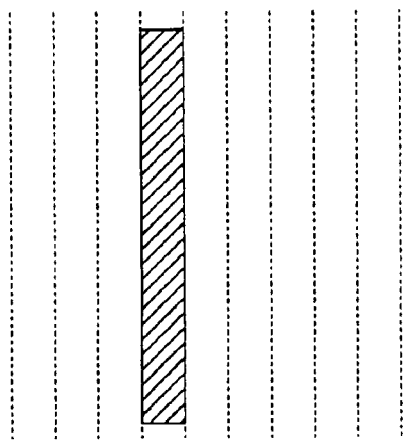
Figure 22B:
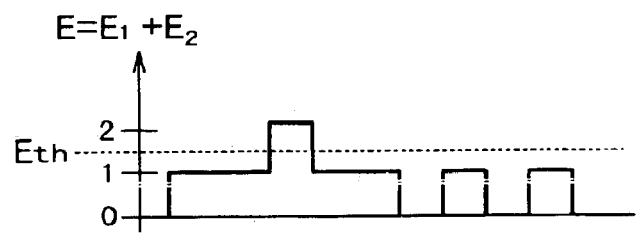

When the projection exposure for forming the exposure pattern of FIG. 22A is performed, after the dual-beam interference exposure and without intervention of a development process, superposedly to the same region of the same resist, the total exposure amount distribution on the resist will be such as shown in the graph at the bottom of FIG. 22B. Here, since the ratio between the exposure amount $E_1$ of dual-beam interference exposure and the exposure amount $E_2$ of the projection exposure is set at 1:1 while the exposure threshold $E_{th}$ of the resist is set within a range between the exposure amount $E_1$ (=1) and the sum (=2) of the exposure amount $E_1$ and the exposure amount $E_2$ of the projection exposure, a lithographic pattern such as shown at the upper portion of FIG. 22B can be formed. The isolated linear pattern shown in the upper portion of FIG. 22B has a resolution corresponding to that of the dual-beam interference exposure, and there is no simple periodic pattern. Thus, a high resolution pattern having a resolution higher than that as can be attained by the ordinary projection exposure, is produced on the semiconductor wafer.

In addition to the method described above, there are some other methods for the multiple exposure process. Another example will be described below.

Figure 23:
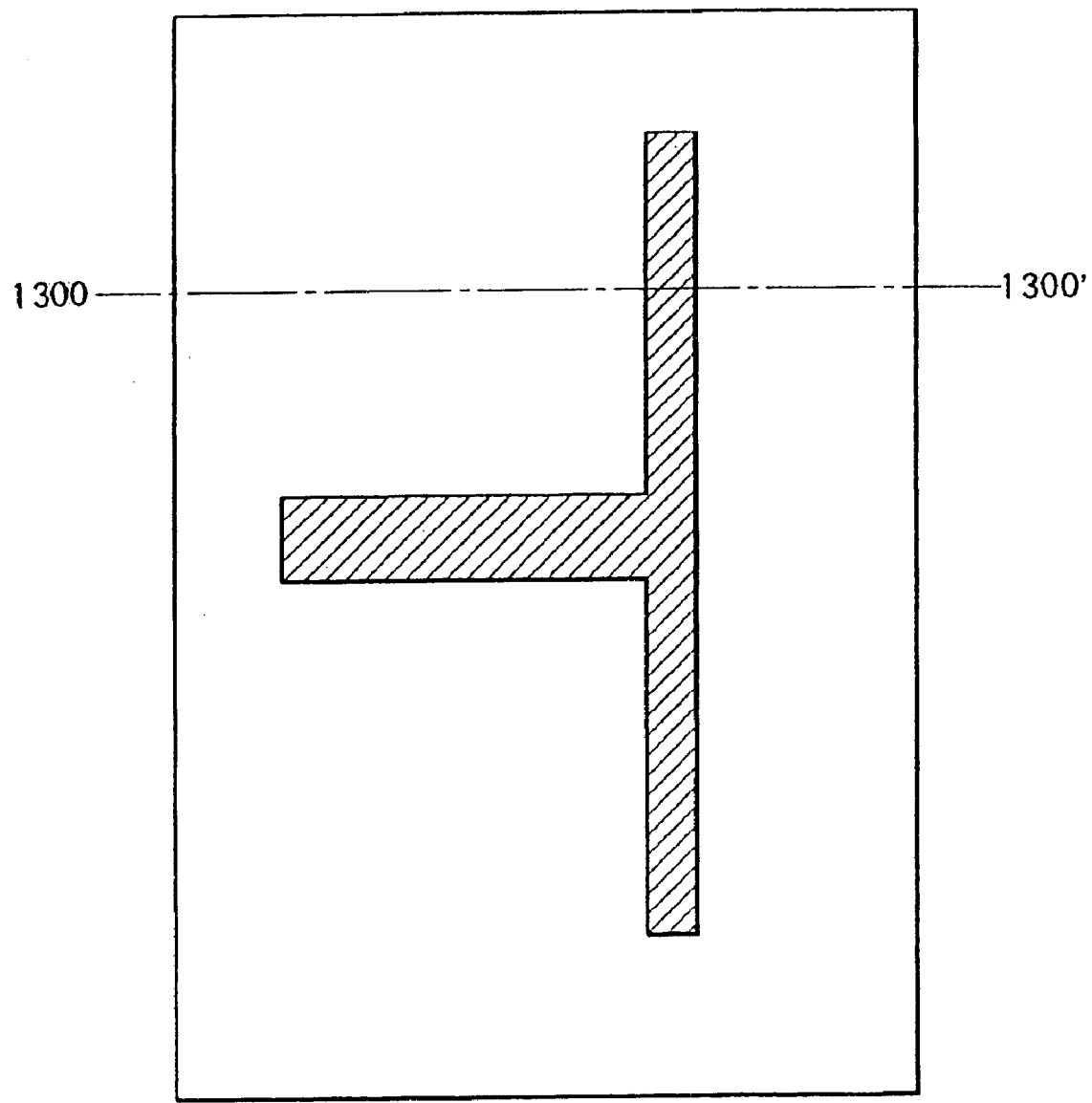
FIG. 23 is a schematic view of an example of a mask to be used for dual exposure by which a defocused image is superposed.

FIG. 23 shows a rough pattern mask with which a defocused image of a fine pattern, that can not be resolved by ordinary exposure, is superposed.

This mask has a pattern directly corresponding to a gate having a smallest linewidth L, as being printed on a semiconductor wafer. When the ordinary exposure is performed with this mask, while the region of a linewidth L or more can be resolved, as regards the region of the smallest linewidth, a blurred exposure amount distribution is formed on the resist.

The exposure amount distribution in this portion (1300–1300') will be described below in detail.

Figure 24A:
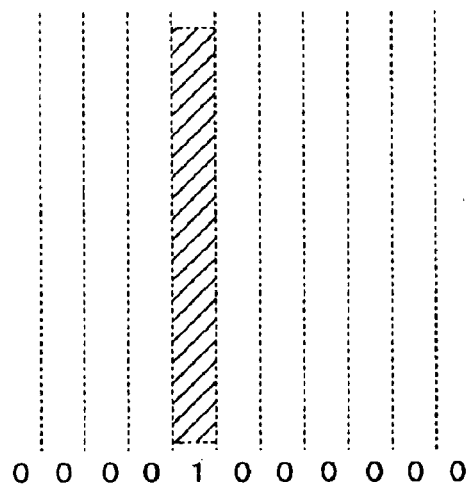
FIGS. 24A, 24B, 24C and 24D are schematic views, respectively, for explaining an exposure pattern to be formed through dual exposure.
Figure 24B:
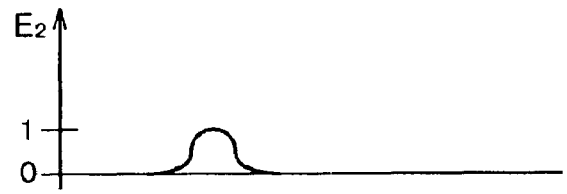

FIG. 24A shows an exposure pattern in the ordinary exposure, and FIG. 24B shows the state of exposure corresponding to it. Since this exposure pattern is a fine pattern smaller than the resolving power of the exposure apparatus, it cannot be resolved. Thus, the intensity distribution on the substrate being exposed is blurred and expanded. Here, the exposure pattern comprises a fine pattern having a linewidth about a half of the resolution power of the ordinary projection exposure.

Figure 24C:
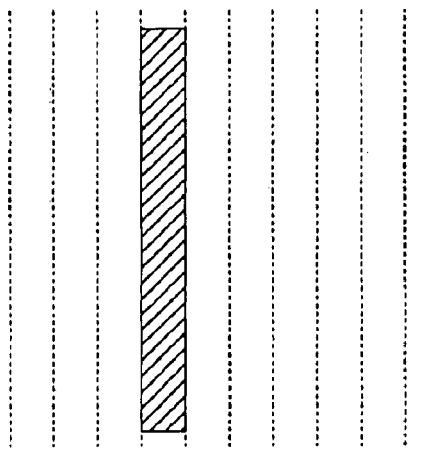
Figure 24D:
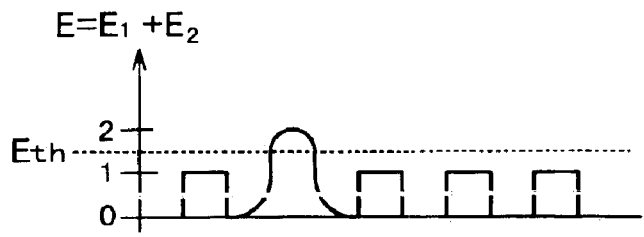

The projection exposure for forming the exposure pattern of FIG. 24C is performed, after the periodic pattern exposure of FIG. 20A and without intervention of a development process, superposedly to the same region of the same resist. At that time, the center of the ordinary exposure pattern is registered with the peak of the periodic pattern. Then, the total exposure amount distribution on the resist will be such as shown in the graph of FIG. 24D. Here, since the ratio between the exposure amount $E_1$ of the periodic pattern exposure and the exposure amount $E_2$ of the projection exposure is set at 1:1 while the exposure threshold $E_{th}$ of the resist is set within a range between the exposure amount $E_1$ (=1) and the sum (=2) of the exposure amount $E_1$ and the exposure amount $E_2$ of the projection exposure, as a result of a development process, a lithographic pattern such as shown in FIG. 24C is formed on the semiconductor wafer. The isolated linear pattern shown in FIG. 24C has a resolution corresponding to that of the periodic pattern exposure, and a simple periodic pattern itself is not developed. Thus, a high resolution pattern having a resolution higher than that as can be attained by the ordinary projection exposure, is produced. It is to be noted that the exposure amounts 1 and 2 are referred to only for convenience in explanation, and they have no specific physical significance.

Figure 25A:
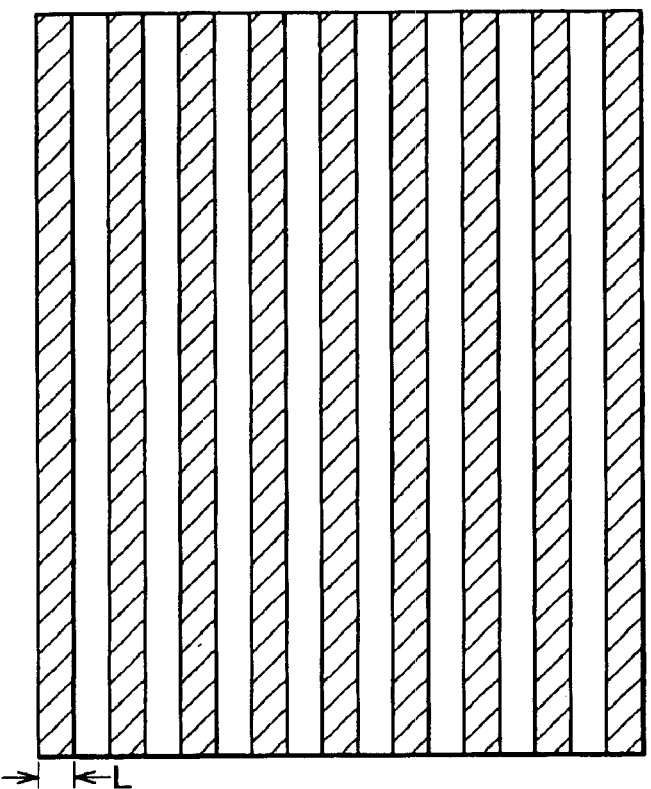
FIGS. 25A and 25B are schematic views, respectively, for explaining the principle of triple exposure for forming a contact region.
Figure 25B:
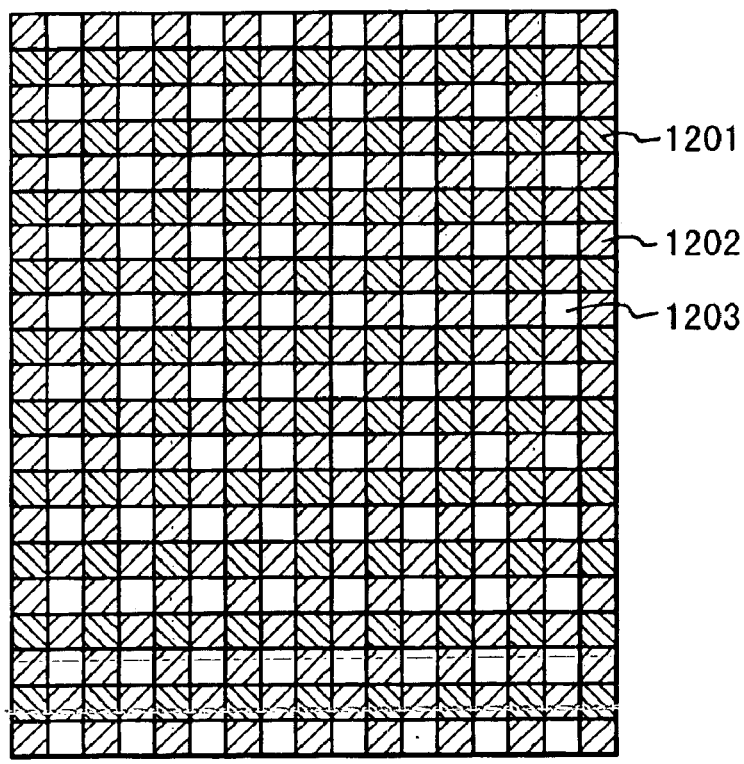

FIGS. 25A and 25B illustrate the principle of the triple exposure method, for forming a contact region. First, a Levenson pattern which comprises a stripe-like pattern having a linewidth and a spacing of L, when printed on a semiconductor wafer, is photoprinted by use of an exposure apparatus according to the dual-beam interference exposure method and with an exposure amount 1. Subsequently, the Levenson pattern as being rotated by 90 deg. is photoprinted with an exposure amount 1. As a result of the above, the semiconductor wafer is exposed in the state such as shown in FIG. 25B. In FIG. 25B, denoted at 1201 are those regions (Levenson double exposure regions) having been exposed twice through the Levenson pattern. Denoted at 1202 are those regions (Levenson single exposure regions) having been exposed once through the Levenson pattern. Denoted at 1203 are those regions (Levenson unexposed regions) not having been exposed during the Levenson pattern exposure. Each Levenson double exposure region 1201 has been exposed with an exposure amount 2. The exposure amount 2 has been set to a level lower than the exposure threshold $E_{th}$ of a photoresist applied to the substrate to be exposed.

After printing two orthogonal Levenson patterns upon the substrate in the manner described above, a rough mask pattern 1204 such as shown in FIG. 26A is printed in accordance with the ordinary exposure process and with an exposure amount 1. As a result of this, only those portions having been exposed superposedly by the Levenson double exposures 1201 and the rough mask pattern 1204 exposure, have been exposed with an exposure amounts 3. Here, the exposure amounts of respective patterns may be so determined that the exposure threshold $E_{th}$ of the photoresist is at a level between the exposure amount 2 and the exposure amounts 3. On the basis of this, a photoresist pattern of square shape having each side of a length L can be produced. Here, the exposure amounts 1, 2 and 3 are referred to only for convenience in explanation, and they have no specific physical significance.

An inter-layer insulating film comprising a silicon oxide film, for example, may be formed on the polysilicon gate 1103 of FIG. 19D in accordance with a CVD method, for example. After this, the inter-layer insulating film may be etched in accordance with the photoresist pattern formed through the triple exposure method described above, by which a contact hole 1205 can be formed. FIG. 26B is a plan view of it, and FIG. 26C is a sectional view taken along a line 26C–26C' in FIG. 26B. In FIGS. 26B and 26C, denoted at 1205 is a contact hole, and denoted at 1206 is an inter-layer insulating film.

FIGS. 27A–27C show the process for forming a wiring region. The rough mask pattern shown in FIG. 27A is photoprinted through the ordinary exposure method, whereby a photoresist pattern is produced. A metal layer such as aluminum may then be formed on the inter-layer insulating film 1206 and the contact hole 1205 described above, through a sputtering method, for example. Subsequently, the metal layer may be etched in accordance with the photoresist pattern formed through the ordinary exposure method described above, whereby a desired wiring pattern can be produced. The metal layer formed on the contact hole 1205 is electrically communicated with the source and drain region 1105 in the silicon active region, and electrodes of an MOS transistor are provided. FIG. 27B is a plan view, and FIG. 27C is a sectional view taken on a line 27C–27C' in FIG. 27B. Denoted at 1301 is a metal wiring layer.

[Embodiment 6]
(Device Manufacturing Method)

Next, an embodiment of a semiconductor device manufacturing method which uses an exposure method according to any one of the preceding embodiments, will be explained.

Figure 28:
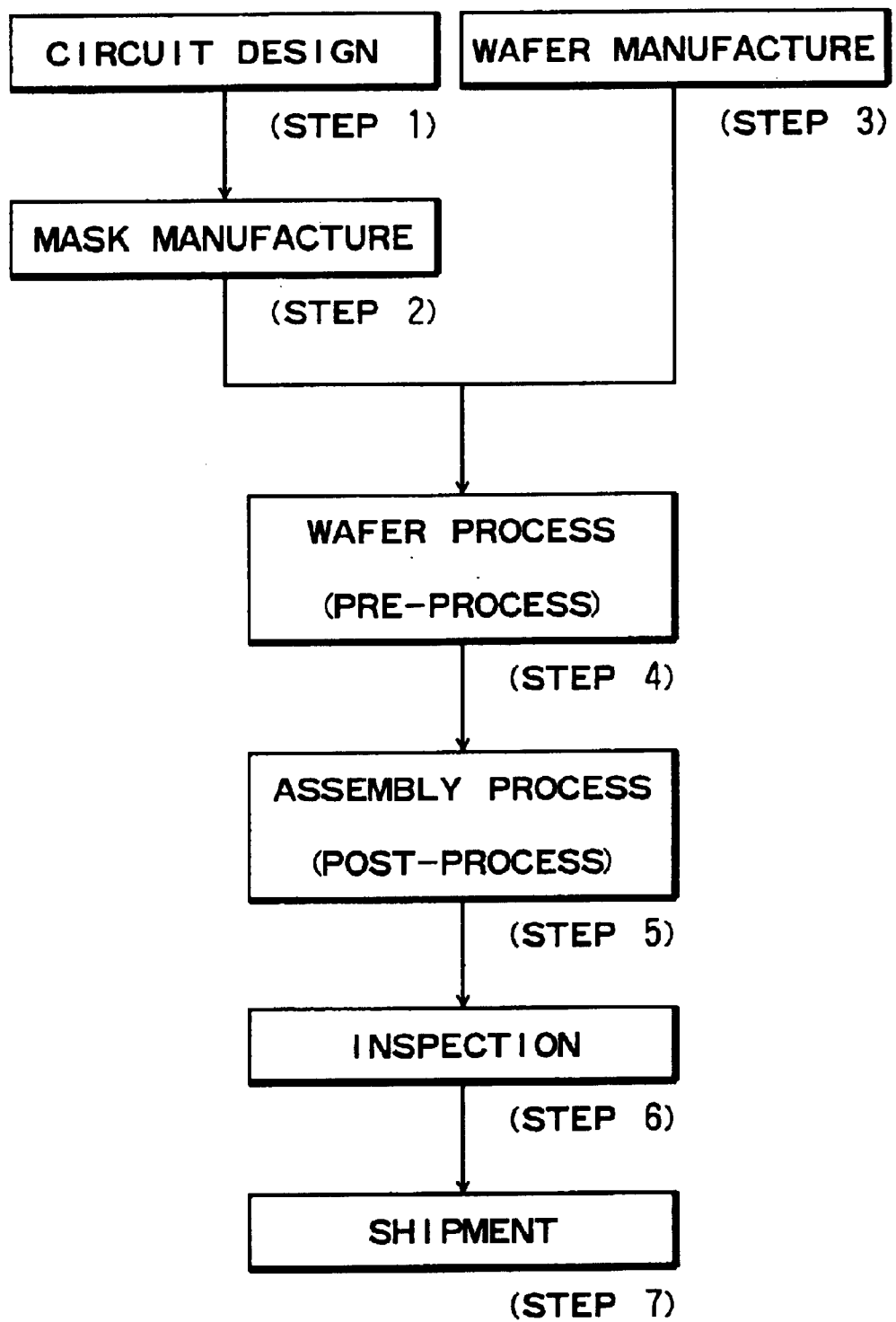
FIG. 28 is a flow chart for explaining the procedure for manufacturing a microdevice.

FIG. 28 is a flow chart of a procedure for the manufacture of microdevices such as semiconductor chips (e.g., ICs or LSIs), liquid crystal panels, CCDs, thin film magnetic heads or micro-machines, for example.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process (called a pre-process) wherein, by using the so prepared mask and wafer, circuits are practically formed on the wafer through lithography. Step 5 subsequent to this is an assembling step (called a post-process) wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7).

Figure 29:
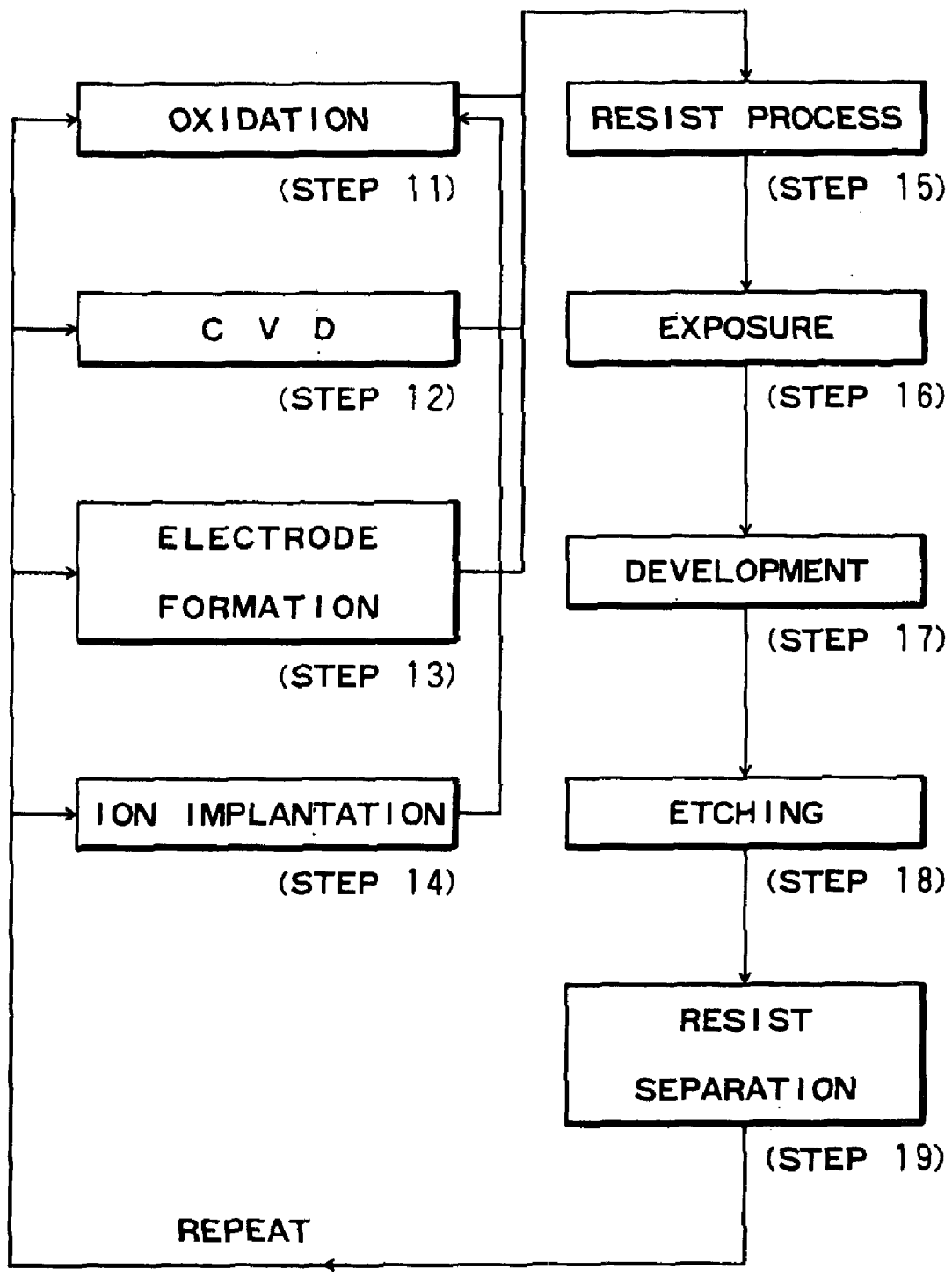
FIG. 29 is a flow chart for explaining details of a wafer process, included in the procedure of FIG. 28.

FIG. 29 is a flow chart showing details of the wafer process.

Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing the circuit pattern of the mask on the wafer in accordance with an exposure process based on the smallest linewidth to be printed, such as a multiple exposure process or an ordinary exposure process described hereinbefore, for example. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

In this embodiment, the multiple exposure process is used for production of a gate pattern and a contact hole. However, the invention is not limited to this, but it may be applied to production of a fine wiring.

In accordance with the device manufacturing method of this embodiment, high density microdevices can be manufactured with a lower cost.

In the embodiments of the present invention described hereinbefore, the fine-pattern exposure region is made larger than the chip-inside-device forming region so that the former includes the latter. As a result, a fine pattern not influenced by the edge effect of the pattern, the proximity effect, or the micro-loading effect, can be used in the chip-inside-device forming region. Also, all the above-described fine pattern or patterns may be formed on a single mask so that it or they may be photoprinted in a single exposure operation. This accomplishes uniformness of control of the exposure amount distribution over a wide range and of the state of the resist after the exposure (e.g., oxide diffusion), and thus high precision production of a semiconductor chip is assured. Particularly, in a chemical amplification type resist, the time from the exposure to the development has a large influence to the linewidth (CD). Therefore, making uniform the time from the exposure to the development is effective to improve the precision of a device such as a semiconductor chip, for example.

While the invention has been described with reference to the structures disclosed herein, it is not confined to the details set forth and this application is intended to cover such modifications or changes as may come within the purposes of the improvements or the scope of the following claims.

What is claimed is:

1. A method of producing a semiconductor chip, said method comprising:

a first exposure step for exposing a device range inside a chip on a substrate, to a repetition pattern comprising a line and a space having a predetermined width, wherein an exposure region of the repetition pattern has a size greater than the whole device range inside the chip, and wherein the space of the repetition pattern is exposed with an exposure amount less than an exposure threshold value of a resist provided on the substrate; and a second exposure step for exposing the device range inside the chip on the substrate, to a pattern which includes a first space to be exposed with an exposure amount less than the exposure threshold value and a second space to be exposed with an exposure amount not less than the exposure threshold value, wherein each of the first space and the second space includes a portion having a width more than twice the predetermined width, wherein said first and second exposure steps are carried out without a developing step interposed therebetween, and wherein the sum of the exposure amounts of exposures of the space of the repetition pattern and of the first space is not less than the exposure threshold value.

2. A method according to claim 1, wherein the repetition pattern has a regular periodicity.

3. A method according to claim 2, wherein the periodic pattern has a pattern width not greater than 0.15 micron.

4. A method according to claim 2, wherein the periodic pattern has a pattern width not greater than 0.12 micron.

5. A method according to claim 2, wherein the periodic pattern includes a first periodic pattern and a second periodic pattern having a direction of array being different from the first periodic pattern.

6. A method according to claim 5, wherein the first and second periodic patterns are arrayed along orthogonal directions.

7. A method according to claim 1, wherein a device produced by said method has at least one of (i) a region in which an active element such as an MOS transistor, a bipolar transistor and a diode is formed, (ii) a region in which a passive element such as a resistor element and a capacitance element is formed, and (iii) a contact region for electrical connection between the active and passive elements.

8. A method according to claim 1, wherein each of the first space and the second space includes a portion parallel to the space of the repetition pattern.

* * * * *

UNITED STATES PATENT AND TRADEMARK OFFICE
CERTIFICATE OF CORRECTION

PATENT NO. : 6,828,085 B2
DATED : December 7, 2004
INVENTOR(S) : Tetsunobu Kochi et al.

It is certified that error appears in the above-identified patent and that said Letters Patent is hereby corrected as shown below:

Title page,
Item [*] Notice:, after "0 days.", insert the following paragraph:
-- This patent issued on a continued prosecution application filed under 37 C.F.R. 1.53 (d), and is subject to the twenty year patent term provisions of 35 U.S.C. 154(a)(2). --.

Column 10,
Line 3, "being remained" should read -- remaining --.
Line 9, "a FIG. 17C" should read -- and FIG. 17C --.
Line 26, "method" should read -- method and the standard or ordinary exposure method --.
Line 28, "patterns" should read -- patterns are printed as well as the patterns --.

Column 11,
Line 53, "can not" should read -- cannot --.

Column 12,
Lines 57 and 61, "amounts" should read -- amount--.

Signed and Sealed this

Tenth Day of May, 2005

JON W. DUDAS
*Director of the United States Patent and Trademark Office*